United States Patent [19]

Tokailin et al.

[11] Patent Number: 5,126,214

[45] Date of Patent: Jun. 30, 1992

[54] ELECTROLUMINESCENT ELEMENT

[75] Inventors: Hiroshi Tokailin; Chishio Hosokawa; Tadashi Kusomoto, all of Sodegaura, Japan

[73] Assignee: Idemitsu Kosan Co., Ltd., Tokyo, Japan

[21] Appl. No.: 488,702

[22] Filed: Mar. 5, 1990

[30] Foreign Application Priority Data

Mar. 15, 1989 [JP] Japan ............... 1-60665
Nov. 9, 1989 [JP] Japan ............... 1-289907

[51] Int. Cl.$^5$ ............... H01J 1/62; H05B 33/14
[52] U.S. Cl. ............... 428/690; 428/691; 428/917; 428/216; 313/503; 313/504; 313/505; 313/506
[58] Field of Search ............... 428/690, 917, 691, 212, 428/216; 313/503, 504, 502, 505, 506-509

[56] References Cited

U.S. PATENT DOCUMENTS

| | | | |
|---|---|---|---|
| 4,338,258 | 7/1982 | Brinkwerth et al. | 260/456 A |
| 4,551,265 | 11/1985 | Brinkwerth et al. | 252/301.17 |
| 4,741,976 | 5/1988 | Eguchi et al. | 428/690 |
| 4,876,029 | 10/1989 | Gusten et al. | 252/301.17 |
| 5,015,999 | 5/1991 | Imai et al. | 340/702 |

FOREIGN PATENT DOCUMENTS

| | | |
|---|---|---|
| 2938132 | 4/1981 | European Pat. Off. |
| 3408028 | 9/1985 | European Pat. Off. |
| 281381 | 9/1988 | European Pat. Off. |
| 0319881 | 6/1989 | European Pat. Off. |
| 2-37385 | 2/1990 | Japan |

OTHER PUBLICATIONS

Patent Abstracts of Japan, vol. 14, No. 7 (C-673) (3950) Jan. 1990 JP-A-1 254791.
Chemical Abstracts, vol. 104, No. 14, Apr. 1986, S. Yuji, "White Light-Emitting Electroluminescent Device", p. 646, No. 119708T.

*Primary Examiner*—Ellis P. Robinson
*Assistant Examiner*—Charles R. Nold
*Attorney, Agent, or Firm*—Frishuaf, Holtz, Goodman & Woodward

[57] ABSTRACT

An electroluminescent element comprising an electroluminescent (EL) material part which emits a near ultraviolet ray of light and a fluorescent material part which absorbs the ultraviolet light emitted from the electroluminescent material and emits a fluorescence in a visible light range from blue to red. The electroluminescent element provides for emission of lights with a wide range of wavelength and three elementary colors of blue, green and red can be expressed by appropriate combinations of the organic EL material and the fluorescent material. Consequently, the electroluminescent element provides for a full color display.

16 Claims, No Drawings

ELECTROLUMINESCENT ELEMENT

BACKGROUND OF THE INVENTION

1. Field of the Invention

The present invention relates to an electroluminescent element, and more particularly to an electroluminescent element which is comparatively inexpensive and easy to produce, and is capable of emitting a blue visible light to a red one in a wide range of wavelength.

2. Detailed Description of the Related Arts

An electroluminescent element (hereinafter referred to as an "EL element") has a high distinguishability because it emits light therefrom, and has a large impact-resistance because it is a complete solid element. Various EL elements employing inorganic or organic compounds as the emitting layer have heretofore been proposed and have been under investigation for their practical use. Also proposed are luminescent elements having a structure, in which an electroluminescence and a fluorescence using it as an excitation light are co-used, have been proposed, and the arts as below have been developed.

For example, in Japanese Patent Application Laid-Open Nos. 25195/1985, 170194/1985, and 51796/1986, proposed is an EL element using an emitting layer the mixture of an inorganic EL material emitting bluish green light (including ZnS:CaCl, ZnS:CuMn, and so forth) and rhodamine-based fluorescent dye, to obtain a white light. According to these propositions, however, the fluorescent material emitting light is difficult to replace, since said EL material and fluorescent dye are mixed. As the bluish green EL light as excitation light is always included, the resulting light becomes whitened, and said EL element is not proper as the element for changing color. In addition, it suffers from the problem that a light of pure white in chromaticity cannot be obtained.

In Japanese Patent Application Laid-Open No. 220597/1985, proposed is a combined use of an electroluminescent fluorescent material which emits light with a peak wavelength of 460 to 520 nm (an inorganic EL material using ZnS : CuCl, for instance) and a wavelength-changing fluorescent material which emits light with a peak wavelength of 590 to 610 nm (specifically, coumarin- or rhodamine-based compound) upon the application of DC current. In that proposition, three kinds of EL elements are mentioned, that is, a single emitting layer in which these two materials are mixed; a laminate of these two materials, to be interposed between the cathode and the anode; and an EL element wherein a wavelength-changing (or a wavelength-converting) material is laminated entirely outside the structure of EL element. In that art, however, an inorganic material of DC current application-type is used as the EL element, and the range of its wavelength is so limited that the emitted light cannot change into various colors.

European Patent Publication No. 0281381, further, discloses an EL element having a structure in which an organic EL material such as 8-hydroxy-quinoline as the host material and a wavelength-changing fluorescent material such as a coumarin-based compound as a guest material are used, and a emitting layer consisting of these two materials is laminated on the hole injection layer. By doping a fluorescent material in a trace amount (1 mol % or smaller) to the emitting layer comprising an organic EL material, a red light to a green light with a high brightness is emitted. Therein, the mechanism of changing wavelength is not merely a mechanism in which the light emitted from the host material is absorbed by the guest material to emit therefrom, but is the result of transportation of energy from the host material to the guest material (J. Appl. Phys. 65. 3610 (1989)). According to said mechanism, an emission in a high efficiency is obtained indeed, but the resulting light is restricted to red to green light with a longer wavelength, since the light emitted from the host material has the wavelength of the green-range. Moreover, as a very slight amount of the guest material must be doped into the host material, it is difficult to form the emitting layer. Replacement of the guest material is also difficult, and consequently, said mechanism has a disadvantage that the color of the light cannot be changed easily. Further, the host and the guest must be closely adhered (the guest must be dispersed into the host), since transfer of energy is utilized.

Japanese Patent Application Laid-Open No. 51781/1982 (Japanese Patent Publication No. 7635/1989) proposes an organic EL element wherein the emitting zone comprises two emitting materials and the second emitting material is capable of changing the wavelength of the light emitted from the first emitting material.

Specifically, in an example disclosed, polystyrene dispersion film of tetraphenylbutadiene is used as the first emitting material, and the deposition film of the perylene-based compound is used as the second emitting material. The first emitting material alone emits a blue light with a peak wavelength of 467 nm, and when the second emitting material is added thereto, the emitted light is shifted to a near infrared ray with a peak wavelength of 810 nm. However, the light after change is not visible, and the second emitting material emits by a transfer of energy from the first emitting material in an excited state. Accordingly, it is required to make the film thickness of the first and the second emitting materials as small as 1000 Å, respectively, to adhere these two materials closely. A further problem is that it is impossible to replace the fluorescent material part to change the color of light.

SUMMARY OF THE INVENTION

An object of the present invention is to provide an EL element which emits blue to red light.

Another object of the present invention is to provide an EL element to be used as an element for emitting white light.

The present inventors found out that the abovementioned objects can be attained by combining an organic EL material and a wavelength-changing fluorescent material.

The present invention provides an electroluminescent element which comprises an organic electroluminescent material part and a fluorescent material part absorbing the light emitted from said electroluminescent material and emitting a visible fluorescent light.

DESCRIPTION OF THE PREFERRED EMBODIMENT

In the present invention, the organic EL material part is not critical for its form, as long as in emits excitation light, in other words, it has a layer containing an emitting material (emitting layer). In the present invention, since an organic EL element that is capable of emitting a ultraviolet ray to blue light with a shorter wavelength is used as the origin of excitation light, the fluorescent material for changing the wavelength can be selected from a wider range, unlike the conventional inorganic EL element (which emits light with a longer wavelength than that of bluish green light). Accordingly, it is possible to obtain much more wavelength-changing light.

The emitting material in the organic EL material part of the present invention is an organic compound, and specific examples of the compounds according to desired colors are as follows.

(A) To obtain ultraviolet to violet excitation light

The compounds represented by the general formula (I) as below are used.

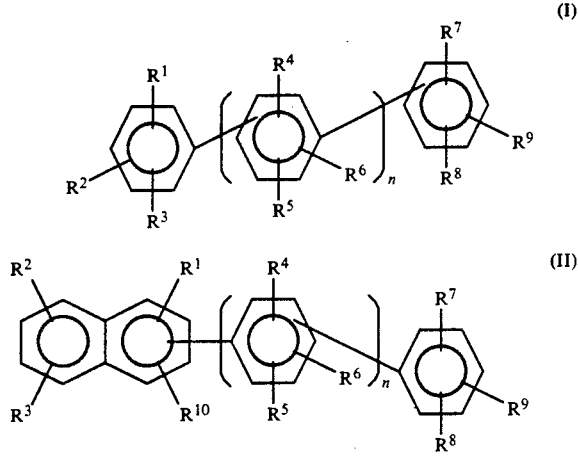

In the general formulae, $R^1$ to $R^{10}$ are independently an hydrogen atom, an alkyl group having 1 to 6 carbon atoms, an alkoxyl group having 1 to 6 carbon atoms, an hydroxyl group, a sulfonic acid group, a sulfonyl group, a carbonyl group, a carboxyl group, an amino group, a dimethylamino group, a diphenylamino group, a cyano group, a halogen atom, an acyloxyl group, an acyl group, an alkoxycarbonyl group, an aryloxycarbonyl group, an aminocarbonyl group or an acylamino group. $R^1$ to $R^{10}$ may combine with each other to form a saturated five-membered ring or a saturated six-membered ring with or without a substituent. n indicates an integer of 2 to 5. Plural $R^4$ to $R^6$ may be each identical or different.

The compounds represented by the general formula (I) or (II) include various ones according to the kind of the substituents $R^1$ to $R^{10}$ in the formulae. Specifically, $R^1$ to $R^{10}$ are each a hydrogen atom, an alkyl group having 1 to 6 carbon atoms (a methyl group, an ethyl group, an isopropyl group, a tert-butyl group and the like), an alkoxyl group (a methoxyl group, an ethoxyl group, a propoxyl group, a butoxyl group, and the like), a hydroxyl group, a sulfonic acid group, a sulfonyl group, a carbonyl group, a carboxyl group, an amino group, a dimethylamino group, a diphenylamino group, a cyano group, a halogen atom (a chlorine, a fluorine, a bromine and an iodine), an acyloxyl group (an acetoxyl group, a benzoyloxy group and the like), an acyl group (an acetyl group, a benzoyl group and the like), an alkoxylcarbonyl group (a methoxycarbonyl group and the like), an aryloxycarbonyl group (a phenoxycarbonyl group and the like), an aminocarbonyl group or an acylamino group (an acetoamino group, a benzamino group and the like). $R^1$ to $R^{10}$ may combine with each other to form a saturated five-membered ring or a saturated six-membered ring with or without a subsituent. n indicates an integer of 2 to 5. $R^4$s to $R^6$s in the number corresponding to the number of n may be identical to or different from each other.

Among these compounds of the present invention, particularly preferred ones are those in which the phenylene groups (substituted phenylene groups) in the general formula (I) or (II) are bonded to the neighboring groups on both sides at the para-position (in other words, compounds having a p-phenylene group (substituted p-phenylene group)), for they have a excellent crystallinity and can be formed into smooth deposition films.

The compounds of the present invention as above are specifically:

p-quater-phenyl (PQP)

3,5,3'''',5''''-tetra-t-butyl-sexiphenyl (TBS)

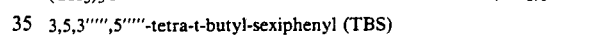

3,5,3'''',5''''-tetra-t-butyl-quinquephenyl (TBQ)

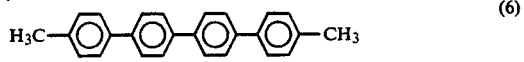

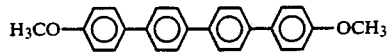
(12)

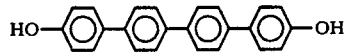
(13)

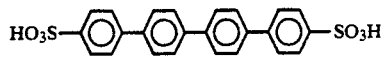
(14)

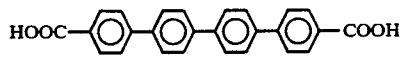
(15)

Particularly preferred are p-quater-phenyl derivatives, and p-quinque-phenyl derivatives.

(B) To obtain blue or bluish green excitation light Stilbene-based compounds and coumarin-based compounds as follows can be used. The compounds given in European Patent Publication No. 0281381 may also be used.

(a) Stilbene-based compounds represented by the general formula (III) or (IV)

$$X-CH=CH-Y-CH=CH-Z \qquad (III)$$

$$X-CH=CH-Z \qquad (IV)$$

wherein X and Z are independently a monovalent aromatic group or a monovalent aromatic complex ring group having one nitrogen atom, and Y is a divalent aromatic group or a divalent aromatic complex ring group having one nitrogen atom.

Stilbene-based compounds represented by the general formula (III) include compounds represented by the formulae (1) to (16) listed below.

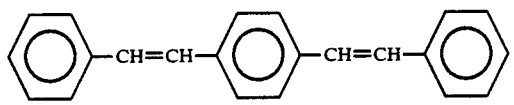
1,4-distyryl benzene
(1)

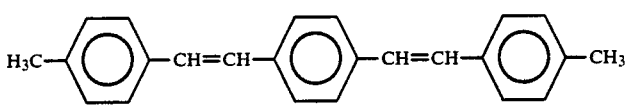
1,4-bis(4-methylstyryl)benzene (PMSB)
(2)

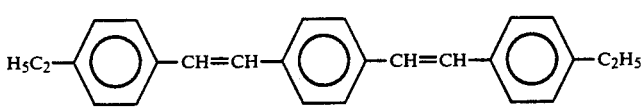
1,4-bis(4-ethylstyryl)benzene (PESB)
(3)

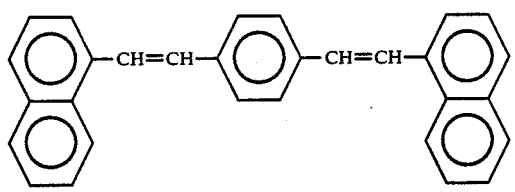
(4)

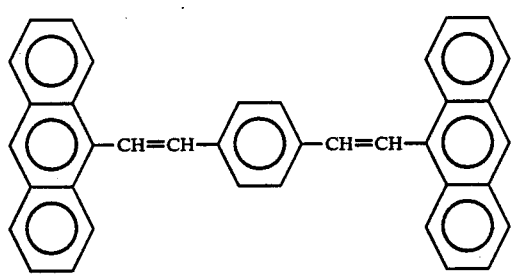
(5)

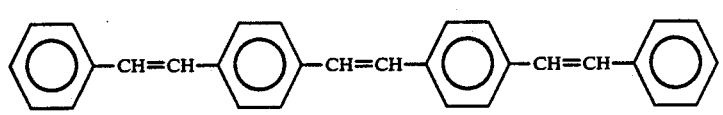
(6)

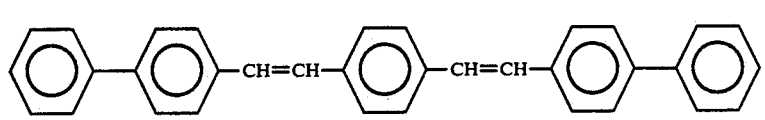
(7)

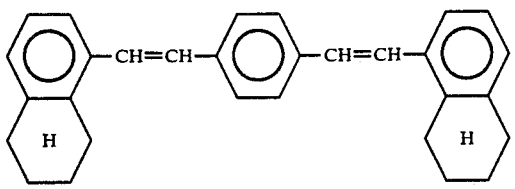
(8)
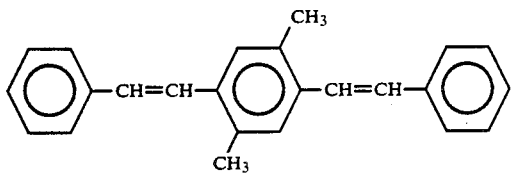
(9)
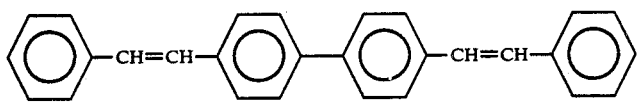
(10)
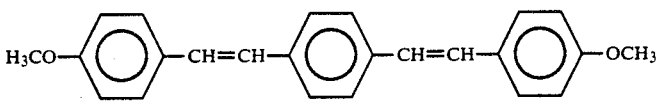
(11)
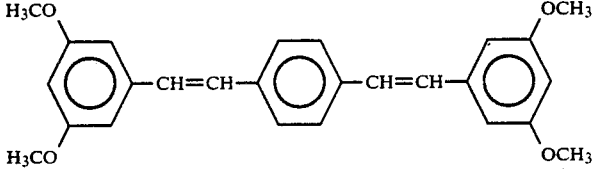
(12)
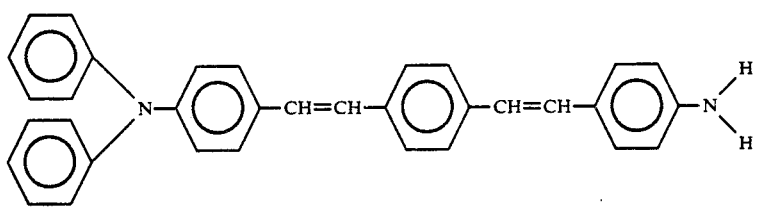
(13)
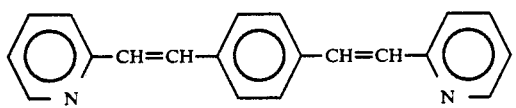
(14)
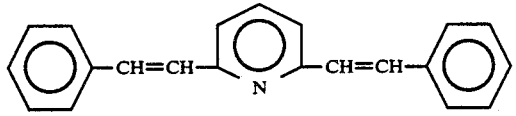
(15)
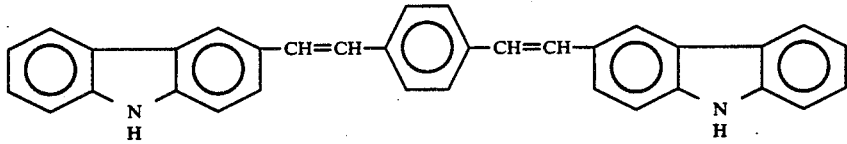
(16)
Stilbene-based compounds represented by the general formula (IV) include compounds represented by the formulae (17) to (22) listed below.
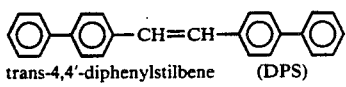
trans-4,4′-diphenylstilbene (DPS)
(17)
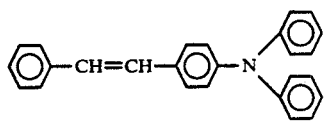
(18)

-continued

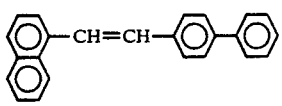
(19)

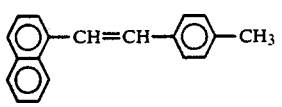
(20)

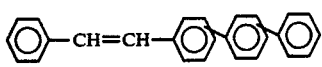
(21)

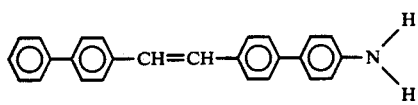
(22)

Phenylene groups may be bonded at either of the ortho-, meta-, and para-position, but usually those bonded at para-position are preferable for improvement in crystallinity. (b) Coumarin-based compounds disclosed in Japanese Patent Application Laid-Open No. 9965/1989. Examples of these compounds are represented by the formulae (1) to (4) listed below.

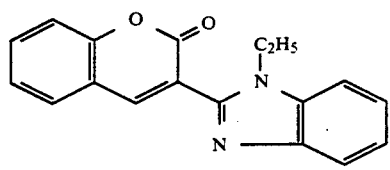
(1)

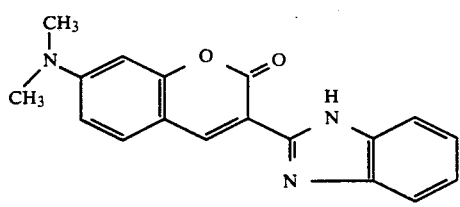
(2)

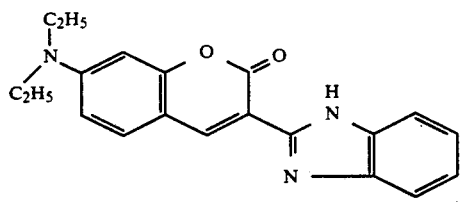
(3)

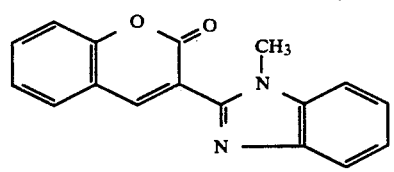
(4)

In the EL element of the present invention, the structure of the abovementioned organic EL material part is not restricted, so long as it has an emitting layer containing the emitting material described above. The thickness of the film is not critical and can be determined appropriately. The film thickness is usually 5 nm to 5 μm. The organic EL material part of the present invention may be formed in various embodiments, but basically formed in such a manner that said emitting layer is sandwiched between two electrodes (anode and cathode). Other layers can be added as needed. Representative formations are: (i) anode/emitting layer/cathode, (ii) anode/hole injection layer/emitting layer/cathode; (iii) anode/hole injection layer/emitting layer/electron injection layer/cathode; and (iv) anode/emitting layer/electron injection layer/cathode. These EL material parts are preferably formed on a substrate. In addition, various kinds of filter layer can be provided.

The emitting layer in the EL material part of the present invention has the following three functions combinedly.

[1] Injection Function

A function to inject holes from the anode or the hole injection layer, and to inject electrons from the cathode or the electron injection layer, upon application of an electric field.

[2] Transport Function

A function to transfer changes (electrons and holes) injected, by electric force.

[3] Light Emitting Function

A function to provide a field in which recombinations take place between electrons and holes, and to relate them to light emission.

There may be a difference in readiness between hole injection and electron injection, and a difference in transport ability which is indicated by the mobility of holes and electrons. It is, however, preferred that either of the charges is transferred.

The abovementioned emitting material (emitting layer) has also an excellent transport function for electrons and holes. Furthermore, it has a good ability to convert into light the excitation caused by charge recombinations in said compounds, their associated forms or their crystals, since they have a strong fluorescence in a solid state.

In the EL element of the present invention, supporting substrates are preferably transparent ones. In general, glass, transparent plastic or quartz is used. It is preferred to use as electrodes (anode and cathode) a metal such as gold, aluminum, indium, magnesium, copper, silver and the like, alloys or mixtured of these metals; alloys or mixtures disclosed in Japanese Patent Application Laid-Open No. 295695/1988; and transparent materials such as indiumtinoxide (mixture of indium oxide and tin oxide; ITO), $SnO_2$, $ZnO$ and the like. Among them, the electrodes of alloys or mixtures disclosed in Japanese Patent Application Laid-Open No. 295695/1988, and transparent electrodes made of ITO, $SnO_2$, or $ZnO$ are preferred, as they require lower voltage for driving the elements.

A metal or an electroconducting compound, both having a large work function, is preferred as the anode, while a metal or an electroconducting compound, both having a small work function, is preferred as the cathode. At least one of these electrodes is preferably transparent or semitransparent, because emitted light is more efficiently taken out when it is transmitted.

The organic EL material part (EL element part) mentioned above comprising (i) anode/emitting layer/cathode is made, for example, according to the following procedure. First, an electrode is prepared by the vacuum deposition method or the sputtering method on a supporting substrate. Therein, the thickness of the electrode in the film form is preferably 10 n to 1 μm, and more preferably not more than 200 nm, for ensuring a high transmittance of light emission.

Then an emitting material mentioned before is formed in a thin film as the emitting layer on the electrode. The thin film of the emitting material can be formed by spin-coating, casting or vacuum deposition. The vacuum deposition method is most preferable, for a film with a high uniformity can be obtained and pinholes are hardly formed in the film according to said method. When a vacuum deposition method is employed for forming the emitting material into thin films, the conditions for said vacuum deposition depend on the kind of compounds to be used, the desired molecular structure of the molecular accumulated film, the association structure and so forth, and cannot be defined specifically, but should be selected within the following range: the temperature for heating the boat: 50° to 400° C., the pressure: $10^{-2}$ to $10^{-6}$ Pa, the deposition rate: 0.01 to 50 nm/sec, and the temperature of the substrate: $-50°$ to $+300°$ C., so that the resulting film becomes 5 nm to 5 $\mu$m in thickness. Particularly, the temperature for heating the boat is preferred to be in the range in which the compound does not decompose. When the opposite electrode in a thickness of 50 to 200 nm is formed by the vacuum deposition method or sputtering process after the formation of the abovedescribed thin film, then the organic EL material part functioning as EL element is obtained.

To obtain an EL material part comprising (ii) anode/hole injection layer/emitting layer/cathode, first an electrode is prepared in the same manner as in the EL material part of abovementioned (i), and then, a hole injection material (hole transfer material) is formed to a thin film as the hole injection layer on the electrode by the vacuum deposition method. The conditions for that procedure can be selected in the same manner as in forming a thin film of an emitting material mentioned before. After that, a thin layer of an emitting material and the opposite electrode are formed in the same manner as in the EL material part of (i) above. The desired organic EL material part of the formation (ii) is thus made. In the EL element of said formation (ii), the hole injection layer and the emitting layer can be formed in the reverse order, that is, in the order of an electrode/emitting layer/hole injection layer/an electrode.

Furthermore, an organic EL material part comprising (iii) anode/hole injection layer/emitting layer/electron injection layer/cathode is made according to the following procedure.

First, an electrode is prepared in the same manner as in the EL material part in the formation (i). Then the hole injection layer is formed in the same manner as in the EL material part of the formation (ii) above. A thin film of an emitting material is formed on it in the same manner as in the EL material part of the formation (i). After that, an electron injection material (electron transfer material) is formed into a thin film by the vacuum deposition method on the emitting layer as the electron injection layer. Lastly, the opposite electrode is formed in the same manner as in the EL material part of (i). The desired EL material part of the formation (iii) is thus made. The order of hole injection layer/emitting layer/electron injection layer can be changed to the order of electron injection layer/emitting layer/hole injection layer to make an EL material part according to the order of electrode/electron injection layer/emitting layer/hole injection layer/electrode.

To form the EL material part of formation (iv), the procedure up to formation of an emitting layer is the same as in formation (i), and then the procedures for forming the electron injection layer and after that in formation (iii) are repeated. Therein, the order of formation of emitting layer/electron injection layer can be reversed, as in formations (i) to (iii) mentioned above.

In the EL element of the present invention, layers such as the hole injection layer and the electron injection layer are not always necessary, but these layers contribute to the improvement in light emission performance. The hole injection layer is made of a hole transfer compound (hole injection material), and has a function to transfer holes injected from the anode to the emitting layer. By sandwiching this layer between the anode and the emitting layer, more holes are injected into the emitting layer at a lower voltage, increasing the brightness of the element.

The hole transfer compounds to be used as the hole injection layer are those which can properly transfer the holes to the emitting layer, when the layer is placed between two electrodes and an electric field is applied between them, and the holes are injected from the anode. More holes are injected into the emitting layer with a weaker electric field by sandwiching the hole injection layer between the anode and the emitting layer.

Furthermore, electrons injected from the cathode or the electron injection layer are accumulated in the emitting layer in the vicinity of the interface between the emitting layer and the hole injection layer, because of the barrier of electrons existing on the said interface, increasing the light emission efficiency. A preferred hole transfer compound has a hole mobility of at least $10^6$ $cm^2$/V.sec, when the layer is placed between the electrodes between which an electric filed of $10^4$ to $10^6$ V/cm is applied. Accordingly, preferred examples of the hole transfer compounds are those which are used as the charge transport material for holes in the photoconductive materials.

Examples of the said charge transport materials are as follows:

(1) triazole derivatives described in the specification of U.S. Pat. No. 3112197, (2) oxadiazole derivatives described in the specification of U.S. Pat. No. 3189447, (3) imidazole derivatives described in Japanese Patent Publication No. 16096/1962, (4) polyarylalkane derivatives described in the specifications of U.S. Pat. Nos. 3615402, 3820989 and 3542544, Japanese Patent Publication Nos. 555/1970 and 10983/1976, and further, in Japanese Patent Application Laid-Open Nos. 93224/1976, 7105/1980, 4148/1981, 108667/1980, 156953/1980, 36656/1981, etc., (5) pyrazoline derivatives or pyrazolone derivatives, described in the specifications of U.S. Pat. Nos. 3180729 and 4278746, and Japanese Patent Application Laid-Open Nos. 88064/1980, 88065/1980, 105537/1974, 51086/1980, 80051/1981, 88141/1981, 45545/1982, 112637/1979, 74546/1980, etc., (6) phenylenediamine derivatived described in the specifications of U.S. Pat. No. 3615404, Japanese Patent Publication Nos. 10105/1976, 3712/1971, 25336/1972, and further, in Japanese Patent Application Laid-Open Nos. 53435/1979, 110536/1979, 119925/1979, etc., (7) arylamine derivatives described in the specifications of U.S. Pat. Nos. 3567450, 3180703, 3240597, 3658520, 4232103, 4175961 and 4012376, Japanese Patent Publication Nos. 35702/1974 and 27577/1964, and further, in Japanese Patent Application Laid-Open Nos.

144250/1980, 119132/1981 and 22437/1981 and German Patent No. 1110518, etc., (8) amino-substituted charkone derivatives described in the specifications of U.S. Pat. No. 3526501, etc., (9) oxazole derivatived described in the specifications of U.S. Pat. No. 3257203, etc.,

(10) styrylanthracene derivatived described in Japanese Patent Application Laid-Open No. 46234/1981, etc.,

(11) fluorenone derivatives described in Japanese Patent Application Laid-Open No. 110837/1979, etc.,

(12) hydrazone derivatives described in the specification of U.S. Pat. No. 3717462 and Japanese Patent Application Laid-Open Nos. 59143/1979, 52063/1980, 52064/1980, 46760/1980, 85495/1980, 11350/1982, 148749/1982, etc., and,

(13) stilbene derivatives described in Japanese patent Application Laid-Open Nos. 210363/1986, 228451/1986, 14642/1986, 72255/1986, 47646/1987, 36674/1987, 10652/1987, 30255/1987, 93445/1985, 94462/1985, 174749/1985, 175052/1985, etc.

Furthermore, particularly preferred examples are the compounds as the hole transport layer (aromatic tertiary amines) and the compounds as the hole injection layer (porphyrin compounds) described in Japanese Patent Application Laid-Open No. 295695/1988.

Particularly preferred examples of the hole transfer compounds are those disclosed in JP Nos.: 27033/1978, 58445/1979, 149634/1979, 64299/1979, 79450/1980, 144250/1980, 119132/1981, 295558/1986 and 98353/1986, the specification of U.S. Pat. No. 4127412, etc. Examples of them are shown below.

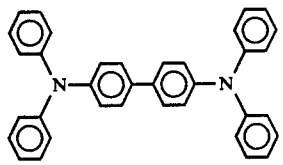

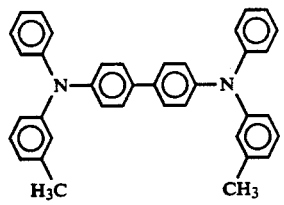

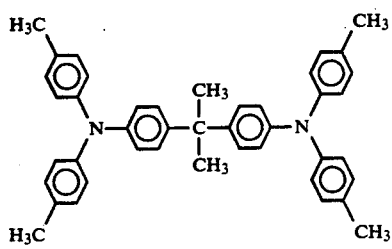

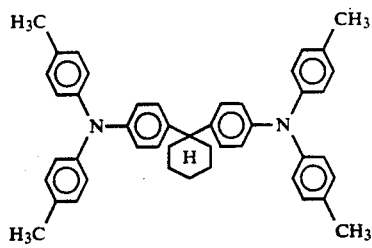

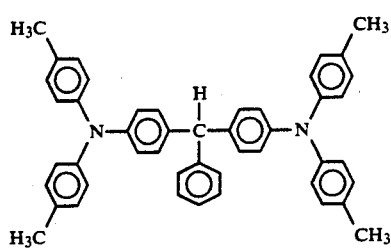

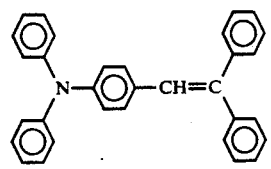

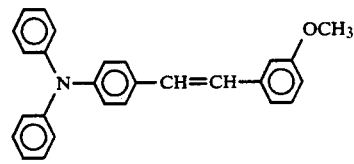

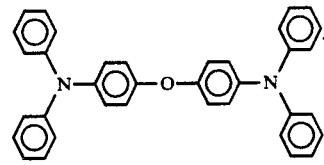

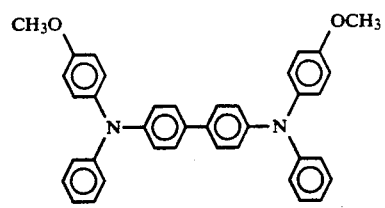

The hole injection layer is formed using these hole transfer compounds. The hole injection layer may consist of one layer, or an accumulation of one of the abovementioned layers and a hole injection layer using other compound.

The electron injection layer (electron injection layer) is made of compounds which transfer electrons. Preferred examples of electron transfer compounds (electron injection materials) for forming the electron injection layer are shown below.

(1) Nitro-substituted fluorenone compounds such as

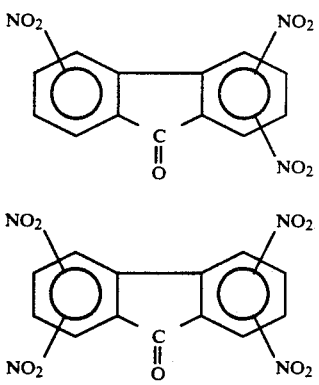

(2) anthraquinodimethane derivatives described in Japanese Patent Application Laid-Open Nos. 149259/1982, 55450/1983, 104061/1988, etc., (3) diphenylquinone derivatives including:

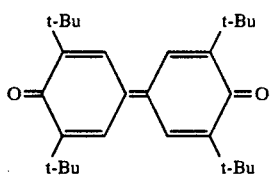

described in Polymer Reprints, Japan, Vol. 37, No. 3 (1988), p681, (4) thiopyrandioxide derivatives including:

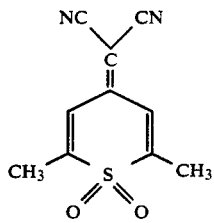

(5) compounds represented by the formulae:

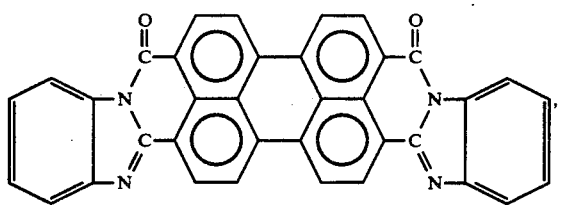,

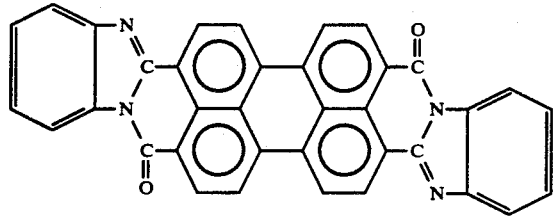

which are described in J.J. Appl. Phys., 27, L 269 (1988), etc., (6) compounds represented by the formula:

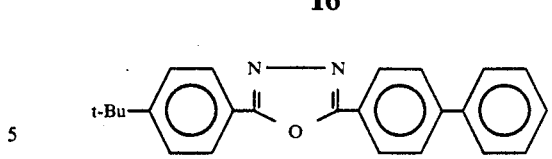

described in Appl. Phys. Lett. Vol. 55 (1989), p.1489, etc., (7) fluorenylidenemethane derivatives described, for example, in Japanese Patent Application Laid-Open Nos. 69657/1985, 143764/1986, and 148159/1986, (8) anthraquinodimethane derivatives and anthrone derivatives, described in Japanese Patent Application Laid-Open Nos. 225151/1986, 233750/1986, etc.

The organic EL material part of the present invention, comprising the abovementioned formation, emits light when a DC voltage of 5 to 40 V is applied with the polarity of the anode and the cathode being positive and negative, respectively. Even if a voltage is applied with the other polarity, no current flows or no light emits. An AC voltage or any pulse voltages can also be applied. In that case, light is emitted only in a bias state with the anode and the cathode being postitive and negative, respectively.

The organic EL material part in the present invention is thus obtained.

The fluorescent material part in the present invention should contain a fluorescent dye which absorbs the light emitted from the emitting layer in the abovementioned organic EL material part, and is capable of changing the wavelength of said light.

Therein, as the fluorescent dye, generally distributed laser dyes and the like are preferred, but the dye is not critical as long as it has a strong fluorescence in the solid state (including a dispersion state in the resin).

Representative examples of the dyes which change light to an ultraviolet ray to blue light are stilbene-based dyes including 1,4-bis(2-methylstyryl)benzene, and trans-4,4'-diphenylstilbene, and coumarin-based dyes including 7-hydroxy-4-methylcoumarin.

To change a blue EL light as the excitation light to green light, coumarin dyes such as 2,3,5,6-1H, 4H-tetrahydro-8-trichloromethylquinolizino (9,9a, 1-gh)coumarin (Coumarin 153) and the like are used.

As the dyes which absorb the excitation light with the wavelength of blue color to green color, and change it to orange to red, cyanine-based dyes such as 4-dicyanomethylene-2-methyl-6-(p-dimethylamino styrylene)-4H-pyran (DCM) and the like, pyridine-based dyes such as 1-ethyl-2-(4-(p-dimethylamino-phenyl)-1,3-butadienyl)-pyridium-perchorat (Pyridine 1) and the like, xanthene-based dyes such as rhodamine B, rhodamine 6G and the like, and oxazine-based dyes.

Said fluorescent material part may be in either form of films of a fluorescent dye as specified above, formed by the vacuum deposition or the sputtering method, and films in which said fluorescent dye is dispersed in a proper resin as bonding resin. In case the fluorescent material part is interposed between the electrodes of the organic EL material part, it can be used in the form of films according to the vacuum deposition method or the spincoat method. Thickness of the film is not critical, as long as the film absorbs EL excitation light sufficiently, without inhibiting the function to emit fluorescence. Generally, appropriate film thickness varies with fluorescent dyes, but is favorably 100 nm to 5 mm.

In case a proper resin is used as the bonding resin, and a fluorescent dye is dispersed into it, that is, in case of resin dispersion type, the concentration of fluorescent dyes dispersed is in the range that quenching of fluorescence by the concentration is not caused and the excitation light can be sufficiently absorbed. Said concentration depends upon the kind of fluorescent dyes, but is preferably $10^{-2}$ to $10^{-4}$ mol/liter based on the bonding resin to be used.

By controlling the thickness of the film, the transmitting strength of the excitation light emitted from the emitting layer of the organic EL material part can be changed. When the film becomes thinner, the light through the fluorescent material part comes near to being white light, because the transmitted component of the EL excitation light and the fluorescent component are mixed. If the film thickness is properly controlled, it is possible to obtain a completely white light in chromaticity.

On the other hand, if the film becomes thicker, the component transmitting EL material becomes less, and a light of fluorescent component alone can be obtained.

The fluorescent material part of the present invention can be thus obtained.

The EL element of the present invention comprises an organic EL material part emitting excitation lights, and a fluorescent material part emitting the changed lights, as described above. Said EL element should have such a structure that the excitation light emitted from the organic EL material part is not reduced, but absorbed efficiently into the fluorescent material part, and that the excitation light emitting from the fluorescent material part is not reduced, but to be taken out.

For that purpose, the fluorescent material part must exist outside of the both electrodes in the organic EL element part. Specific examples of the formation are as follows.

(i) The fluorescent material part is laminated on the transparent electrode or semitransparent electrode in the organic EL material part. Such an EL element comprises, for example, a wavelength converting fluorescent material part/transparent or semitransparent electrode/emitting layer and holes and electrons injection layer/electrode/supporting substrate; or an electrode/emitting layer and holes and electrons injection layer/transparent or semitransparent electrode/wavelength converting fluorescent material part/transparent supporting substrate. (ii) The fluorescent material part is placed in a line with the organic EL material part. In an element, a for example, wavelength converting fluorescent material part is placed side by side with the organic EL material part comprising an electrode/emitting layer and holes and electrons injection layer/electrode, and both are laid on the supporting substrate.

(iii) The fluorescent material part is dispersed in the transparent supporting substrate in the organic EL material, or is laminated on the transparent support substrate. Such EL elements have, for example, formations comprising an electrode/emitting layer and electrons and holes injection layer/transparent or semitransparent electrode/supporting substrate into which a wavelength converting fluorescent material part is dispersed, or a wavelength converting fluorescent material part/transparent supporting substrate/transparent or semitransparent electrode/emitting layer and holes and electrons injection layer/electrode.

(iv) The fluorescent material part is dispersed in the transparent or semitransparent electrode in the organic EL material part, within the concentration range that electric conductivity, and the efficiency of injecting electrons or holes are not reduced largely. Formations of such EL elements, comprises transparent or semitransparent electrodes into which a wavelength converting fluorescent material part is a dispersed/emitting layer and holes and electrons injection layer/electrode/supporting substrate; and an electrode/emitting layer and holes and electrons injection layer/transparent or semitransparent electrode in which wavelength converting fluorescent material part is dispersed/transparent supporting substrate.

In the formations of (i) and (ii), the fluorescent material can be replaced easily.

The EL element of the present invention is described for the embodiments of its formation as above, but is not restricted particularly to these formations.

In the present invention, by varying the combination of the emitting material in the organic EL material part and the fluorescent material in the fluorescent material part, the color of the resulting visible light can be varied.

As described above, the EL element of the present invention can emit light in a very wide wavelength, and is capable of exerting three elementary colors of blue, green and red according to the combination of the organic EL element and the fluorescent material. Consequently, it is capable of displaying all colors.

Moreover, by varying the film thickness of the fluorescent material part and the concentration of the fluorescent material dispersed, the light after transmitting EL is mixed with the fluorescence, to obtain a white light. Accordingly, said element can be utilized as an element for emitting white light.

Furthermore, the fluorescent material part of the EL element can be formed to a detachable laminate type, and the wavelength of the emitted light can be easily varied by replacing the fluorescent material part.

Consequently, the EL element of the present invention can be utilized extensively as various display materials.

The present invention is explained in further details by the following examples.

EXAMPLE 1

(1) Production of Organic EL Material Part

Indium tin oxide (ITO) was provided on a 25 mm×75 mm×1.1 mm glass substrate in a 100 nm thick film form by the vacuum deposition method to obtain a transparent substrate (manufactured by HOYA Co., Ltd.) Said transparent substrate was attached to the substrate holder of a commercially available vacuum deposition system (manufactured by ULVAC Co., Ltd.), 200 mg of N,N'-diphenyl-N,N'-bis-(3-methylphenyl)-[1,1'-biphenyl]-4,4'-diamine (TPDA) was placed in an electrically-heated boat made of molybdenum, and 200 mg of 1,4-bis(4-ethylstyryl)benzene (PESB) was placed into another boat made of molybdenum. The pressure of the vacuum chamber was decreased to $1 \times 10^{-4}$ Pa.

After that, said boat containing TPDA was heated to 215° to 220° C., and TPDA was vacuum deposited onto the transparent substrate at a deposition rate of 0.1 to 0.3 nm/s, to obtain a hole injection layer of 80 nm in thickness.

In this vacuum deposition process, the substrate was at room temperature. Without taking out the substrate, PESB from another boat was laminate-deposited in the thickness of 80 nm on the holes injection layer, to form the emitting layer. The deposition was performed with the boat temperature of 220° to 225° C., at a deposition rate of 0.3 to 0.5 nm/s, and the temperature of the substrate was room temperature.

The substrate was taken out of the vacuum chamber, and a stainless steel mask was placed on the said emitting layer, which was then attached to the substrate holder again.

In the electrically-heated boat made of molybdenum, 1 g of magnesium ribbon was placed, and 500 mg of indium was placed into another boat made of molybdenum.

Then the pressure in the vacuum chamber was decreased to $2 \times 10^{-4}$ Pa, and subsequently indium began to be deposited at the deposition rate of 0.03 to 0.08 nm/s, and simultaneously magnesium in another boat began to be deposited at a deposition rate of 1.7 to 2.8 nm/s.

The temperatures of the boats each containing indium and magnesium were 800° C. and 500° C., respectively. Under the above conditions, an electrode of mixture of magnesium and indium was laminate-deposited in the thickness of 150 nm as the opposite electrode on the emitting layer.

Upon applying a DC voltage of 15 V to the EL element with the ITO electrode as the anode and the magnesium:indium electrode as the cathode, a current of approximately 100 mA/cm$^2$ passed and a blue light was emitted. The peak wavelength determined by spectrometry was 482 nm, and the brightness was 250 cd/m$^2$. The light was sufficiently recognized in a light place.

An origin of blue EL excitation light was thus produced.

(2) Production of Wavelength-Converting Fluorescent Material

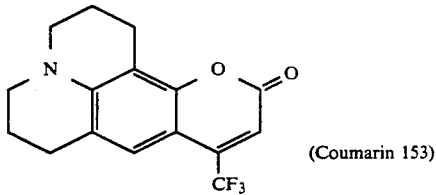

(Coumarin 153)

First, 4 mg of coumarin 153 having the above structure and 1.2 g of polymethylmethacrylate (PMMA) were dissolved into 11 g of dichloromethane, to prepare a dichloromethane solution of PMMA in which coumarin 153 was dispersed. The concentration of dispersing coumarin was $1.3 \times 10^{-2}$ mol/liter-PMMA.

5 ml of said solution was dropped onto a glass substrate of 25 mm × 75 mm × 1.1 mm which was fully washed out in advance, and then developed to the front, and left to stand in atmosphere for one day and night to be air-dried.

After that, said substrate was dried by vacuum drier at a vacuum degree of 0.1 Torr at a temperature of 50° C. for two hours, to remove completely dichloromethane as the solvent. As the result, a PMMA thin film of 80 μm in thickness in which coumarin 153 was dispersed in the above concentration was obtained.

(3) Determination of Emission by EL Element

Upon application of 15 V on the EL element having PESB produced in (1) as the emitting layer, a blue light of 250 cd/m$^2$ was emitted, as mentioned above. The color of the emitted light was blue, and the CIE chromaticity coordinates are: x=0.14, y=0.20.

Then, the coumarin 153 dispersion film produced in (2) was placed on the side of ITO transparent electrode of EL element, and the emission of light upon application of the same voltage of 15 V was observed through the coumarin 153 dispersion film. As the result, a green light of 200 cd/m$^2$ was observed. The emitted light had CIE chromaticity coordinates: x=0.17, y=0.43, which fell under green.

In this way, a green light was easily obtained by placing a coumarin dispersion film as the fluorescent material converting wavelength in front of blue EL light.

EXAMPLE 2

(1) Production of Organic EL Material Part
The same procedure was repeated as in Example 1.
(2) Production of Wavelength Converting Fluorescent Material Part (Structure of DCM)

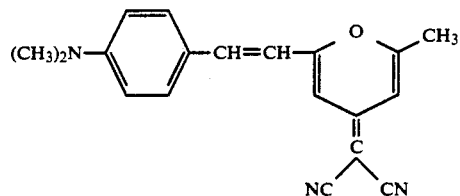

In the same manner as in Example 1,4 mg of DCM having the above structure and 1.2 g of PMMA were dissolved in 11 g of dichloromethane to prepare PMMA dispersion film of DCM. The concentration of DCM dispersed was $1.3 \times 10^{-2}$ mol/liter-PMMA. The thickness of the dispersion film prepared was 80 μm.

(3) Determination of Emission by EL Element

From the EL element having the PESE produced in (1), a light of 250 cd/m$^2$ was emitted upon application of 15 V as described above. CIE chromaticity coordinates of said light were: x=0.14, y=0.20, which fell under blue color.

Then, DCM dispersion film produced (2) was placed on EL element on the side of ITO transparent electrode, and the emission of light on application of 15 V was observed through DCM dispersion film, to obtain a green light having a brightness of approximately 12 cd/m$^2$.

The CIE chromaticity coordinates of the spectrum of said light were: x=0.40, y=0.58, which means the light was yellow green in chromaticity. In this way, when DCM dispersion film as the wavelength converting fluorescent material is placed in front of a blue EL light, a yellow green light was easily obtained.

EXAMPLE 3

(1) Production of Organic EL Material Part
The same procedure was repeated as in Example 1.
(2) Production of Wavelength Converting Fluorescent Material Part (Structure of Pyridine 1)

-continued

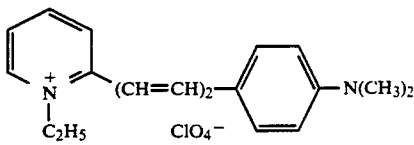

In the same manner as in Example 1, 4 mg of Pyridine 1 having the above structure and 1.2 g of PMMA were dissolved in 11 g of dichloromethane to prepare PMMA dispersion film of Pyridine 1. The concentration of Pyridine 1 dispersed was $1.0 \times 10^{-2}$ mol/liter-PMMA. The thickness of the dispersion film prepared was 80 µm.

(3) Determination of Emission by EL Element

From the EL element having the PESB produced in (1), a light of 250 cd/m² was emitted upon application of 15 V as described above. CIE chromaticity coordinates of said light were: $x=0.15$, $y=0.23$, which fell under blue color.

Then, Pyridine 1 dispersion film produced in (2) was placed on EL element on the side of ITO transparent electrode, and the emission of light on application of 10 V was observed through Pyridine 1 dispersion film, to obtain a white light having a brightness of 100 cd/m².

The CIE chromaticity coordinates of the spectrum of said light were: $X=0.27$, $y=0.37$, which means the light was white in chromaticity. In this way, it was found that a complete white light, that is, the mixture of the light transmitted through EL with the fluorescence from the dye, can be easily obtained, if a dispersion film of a certain kind of dye is used and film thickness and concentration of dispersion are properly selected.

EXAMPLE 4

(1) Production of Organic EL Material Part

ITO was provided on a 25 mm×75 mm×1.1 mm glass substrate in a 100 nm thick film form by the vacuum deposition method to obtain a transparent substrate (manufactured by HOYA Co., Ltd.) Said transparent substrate was attached to the substrate holder of a commercially available vacuum deposition system (manufactured by ILVAC Co., Ltd.)., 200 mg of N,N'-diphenyl-N,N'-bis-(3-methylphenyl)-[1,1'-biphenyl]-4,4'-diamine (TPDA) was placed in an electrically-heated boat made of molybdenum, and 200 mg of p-quater-phenyl (PQP) was placed into another boat made of molybdenum. The pressure of the vacuum chamber was decreased to $1 \times 10^{-4}$ Pa.

After that, said boat containing TPDA was heated to 215° to 220° C., and TPDA was vacuum deposited onto the transparent substrate at a deposition rate of 0.1 to 0.3 nm/s, to obtain a hole injection layer of 80 nm in thickness.

In this vacuum deposition process, the substrate was at room temperature. Without taking out the substrate, PQP from another boat was laminate-deposited in the thickness of 80 nm on the holes injection layer, to form the emitting layer. The deposition was performed with the boat temperature of 218° C., at a deposition rate of 0.3 to 0.5 nm/s, and the temperature of the substrate was room temperature.

The substrate was taken out of the vacuum chamber, and a stainless steel mask was placed on the said PQP layer, which was then attached to the substrate holder again.

In the electrically-heated boat made of molybdenum, 1 g of magnesium ribbon was placed, and 500 mg of indium was placed into another boat made of molybdenum.

Then the pressure in the vacuum chamber was decreased to $2 \times 10^{-4}$ Pa, and subsequently indium began to be deposited at the deposition rate of 0.03 to 0.08 nm/s, and simultaneously magnesium in another boat began to be deposited at a deposition rate of 1.7 to 2.8 nm/s.

The temperature of the boats each containing indium and magnesium were 800° C. and 500° C., respectively. Under the above conditions, an electrode of mixture of magnesium and indium was laminate-deposited in the thickness of 150 nm as the opposite electrode on the PQP layer.

Upon applying a DC voltage of 20 V to 11 pieces of the EL element with the ITO electrode as the anode and the magnesium: indium electrode as the cathode, a current of approximately 25 mA/cm² passed through any of the element and a near ultraviolet area to a visible blue light was emitted. The peak wavelength determined by spectrometry was 420 nm, and the brightness was 0.2 mW/cm² according to the output of the photodiode.

An origin of EL excitation light emitting a near ultraviolet area was thus produced.

(2) Production of Wavelength Converting Fluorescent Material Part

Resin dispersion type of fluorescent material was produced in the same manner as in Example 1.

As the dye, 4-bis(2-methylstyreyl)benzene (OMSB) was used, and 4 mg of OMSB and 1.2 g of PMMA were dissolved in 11 g of dichloromethane, to prepare a PMMA dispersion film of OMSB.

The concentration of dispersion OMSB was $1.3 \times 10^{-3}$ mol/liter-PMMA.

(3) Determination of Emission by EL Element

The EL element having the PQP produced in (1) works as the origin of an excitation light, emitting a near ultraviolet ray (also emitting a visible light).

CIE chromaticity coordinates of the light emitted were: $x=0.16$, $y=0.06$, which fell under purplish blue.

Then, OMSB dispersion film produced in (2) was placed on EL element on the side of ITO transparent electrode, and the emission of light on application of 20 V was observed through the OMSB dispersion film, to obtain a blue light which is visible in a light place.

The CIE chromaticity coordinates of the light emitted were: $x=0.14$, $y=0.19$, which means the light was blue in chromaticity.

In this way, when OMSB dispersion film as the wavelength converting fluorescent material is placed in front of the EL which contains a near ultraviolet ray, the fluorescent material absorbs the EL, to emit a blue fluorescence, and consequently a blue light can be obtained easily.

EXAMPLE 5

(1) Production of Organic EL Material Part

ITO was provided on a 25 mm×75 mm×1.1 mm glass substrate in a 100 nm thick film form by the vacuum deposition method to obtain a transparent substrate (manufactured by HOYA Co., Ltd.) Said transparent substrate was attached to the substrate holder of a commercially available vacuum deposition system (manufactured by ULVAC Co., Ltd.), 200 mg of N,N'-diphenyl-N,N'-bis-(3-methylphenyl)-[1,1'-biphenyl]-4,4'-diamine (TPDA) was placed in an electrically-heated boat made of molybdenum, and 200 mg of 1,4-bis(2,2-di-p-tolylvinyl)benzene (DTVB) was placed into another boat made of molybdenum. The pressure of the vacuum chamber was reduced to $1 \times 10^{-4}$ Pa.

After that, said boat containing TPDA was heated to 215° to 220° C., and TPDA was vacuum deposited onto the transparent substrate at a deposition rate of 0.1 to 0.3 nm/s, to obtain a hole injection layer of 60 nm in thickness.

In this vacuum deposition process, the substrate was at room temperature. Without taking out the substrate, DTVB from another boat was laminate-deposited in the thickness of 80 nm on the holes injection layer, to form the emitting layer. The deposition was performed with the boat temperature of 237° to 238° C., at a deposition rate of 0.1 to 0.3 nm/s, and the temperature of the substrate was room temperature.

The substrate was taken out of the vacuum chamber, and a stainless steel mask was placed on the said emitting layer, which was then attached to the substrate holder again.

In the electrically-heated boat made of molybdenum, 1 g of magnesium ribbon was placed, and 500 mg of indium was placed into another boat made of molybdenum.

Then the pressure in the vacuum chamber was decreased to $2 \times 10^{-4}$ Pa, and subsequently indium began to be deposited at the deposition rate of 0.03 to 0.08 nm/s, and simultaneously magnesium in another boat began to be deposited at a deposition rate of 1.7 to 2.8 nm/s.

The temperatures of the boats each containing indium and magnesium were 800° C. and 500° C., respectively. Under the above conditions, an electrode of mixture of magnesium and indium was laminate-deposited in the thickness of 150 nm as the opposite electrode on the emitting layer.

Upon applying a DC voltage of 15 V to the EL element with the ITO electrode as the anode and the magnesium:indium electrode as the cathode, a current of approximately 28 mA/cm$^2$ passed and a blue light was emitted. The peak wavelength determined by spectrometry was 486 nm, and the brightness was 210 cd/m$^2$. The light was sufficiently recognized in a light place.

An origin of blue (blue green in chromaticity) EL excitation light was thus obtained.

(2) Production of Wavelength Converting Fluorescent Material Part 5 sheets of PMMA dispersion film of Pyridine 1 produced in Example 3 were superimposed, to prepare a PMMA dispersion film of Pyridine 1 having a thickness of 400 μm.

The concentration of dispersing Pyridine 1 was $1.0 \times 10^{-2}$ mol/liter, similarly in Example 3.

(3) Determination of Emission by EL Element

Upon application of 15 V on the EL element having DTVB produced in (1) as the emitting layer, a blue light of 210 cd/m$^2$ was emitted, as mentioned above. CIE chromaticity coordinates of the emitted light were: $x=0.15$, $y=0.28$, which fell under blue green.

Then, Pyridine 1 dispersion film produced in (2) was superimposed on EL element on the side of ITO transparent electrode, and the emission of light upon application of the voltage of 19.5 V was observed through the Pyridine 1 dispersion film. As the result, an orange light visible in light place was observed. The emitted light had CIE chromaticity coordinates: $x=0.54$, $y=0.45$, which fell under yellowish orange.

In this way, by making thick a Pyridine 1 dispersion film as the fluorescent material converting wavelength, the transmitting component of EL was controlled, to obtain an orange light having mainly fluorescence.

EXAMPLE 6 and 7

With the use of DTVB as an organic EL material part produced in Example 5 (1) and Coumarin 153 produced in Example 1 (2), an emission of light was determined (Example 6).

Further, with the use of DTVB as an organic EL material part produced in Example 5 (1) and DCM produced in Example 2 (2), an emission of light was determined (Example 7). The determinations were performed in the same manner as in Example 1.

The result is shown in the table below.

|  | Before the Change of Wavelength | After the Change of Wavelength |
| --- | --- | --- |
| Example 6 | Blue Green 210 cd/m$^2$ | Green 170 cd/m$^2$ |
| Example 7 | Blue Green 210 cd/m$^2$ | Yellow Green 100 cd/m$^2$ |

Above table shows the color in CIE chromaticity and the brightness of the emitted lights.

The light before the change of the wavelength is a light from EL only without superimposing the fluorescent material, and the light after the change of the wavelength is the emitted light with the fluorescent material superimposed.

EXAMPLE 8, 9 and 10

Emission of light was measured for each case where 1,4-bis(4-methylstyryl)benzene (PMSB) was used as the emitting layer of the organic EL material part, and coumarin 153 produced in Example 1 (2) was used as the fluorescent material (Example 8), where 1,4-bis(4-methylstyryl)benzene (PMSB) was used as the emitting layer of the organic EL material part, and DCM produced in Example 2 (2) was used as the fluorescent material (Example 9), and where 1,4-bis(4-methylstyryl)benzene (PMSB) was used as the emitting layer of the organic EL material part, and Pyridine 1 produced in Example 3 (2) was used as the fluorescent material (Example 0).

The measurement was performed in the same manner as in Example 6, and the organic EL material part was produced in the same manner as in the PESB in Example 1 (1). However, in vacuum deposition of PMSB, the temperature of the boats were set to 230° to 240° C.

The results are shown in the table below.

|  | Before the Change of Wavelength | After the Change of Wavelength |
| --- | --- | --- |
| Example 8 | Blue Green 150 cd/m$^2$ | Green 120 cd/m$^2$ |
| Example 9 | Blue Green 150 cd/m$^2$ | Yellow Green 70 cd/m$^2$ |
| Example 10 | Blue Green 150 cd/m$^2$ | White 60 cd/m$^2$ |

EXAMPLES 11, 12 and 13

Emission of light was measured for each case where trans-4,4'-diphenylstilbene (DPS) was used as the emitting layer of the organic EL material part, and coumarin 153 produced in Example 1 (2) was used as the fluorescent material (Example 11), where trans-4,4'-diphenylstilbene (DPS) was used as the emitting layer of the organic EL material part, and DCM produced in Example 2 (2) was used as the fluorescent material (Example 12), and where trans-4,4'-diphenylstilbene (DPS) was used as the emitting layer of the organic EL material part, and Pyridine 1 produced in Example 3 (2) was used as the fluorescent material (Example 13).

The measurement was performed in the same manner as in Example 6, and the organic EL material part was produced in the same manner as in Example 1 (1) except that the temperature of the boats were 205° to 210° C.

The results are shown in the table below.

|  | Before the Change of Wavelength | After the Change of Wavelength |
| --- | --- | --- |
| Example 11 | Blue 200 cd/m² | Green 160 cd/m² |
| Example 12 | Blue 200 cd/m² | Yellow Green 90 cd/m² |
| Example 13 | Blue 200 cd/m² | White 80 cd/m² |

EXAMPLE 14

(1) Production of Organic EL Material Part

The same procedure was repeated as in Example 5.

(2) Production of Wavelength Converting Fluorescent Material 1

The same procedure was repeated as in Example 5, to produce a thicker PMMA dispersion film of Pyridine 1. 8 sheets of said film were superimposed, to form a PMMA dispersion film of Pyridine 1 having a thickness of 600 μm. (3) Production of Wavelength Converting Fluorescent Material 2

(Rhodamine 6G)

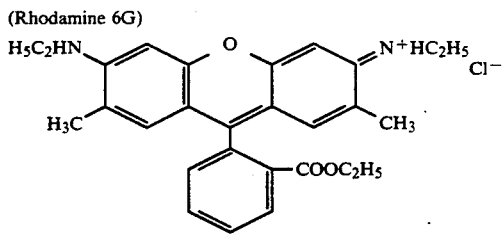

By the casting method as in Example 1 (2), 6 mg of Rhodamine 6G having the above structure and 1.2 g of PMMA were dissolved in 11 g of dichloromethane to prepare a PMMA dispersion film of Rhodamine 6G. The concentration of Rhodamine 6G dispersed was $1.2 \times 10^{-2}$ mol/liter.

The thickness of the PMMA dispersion film prepared was approximately 100 μm.

By superimposing 2 sheets of said film, a PMMA dispersion film of Rhodamine 6G having a thickness of 200 μm.

(4) Production of EL Element

The EL element having an emitting layer of DTVB produced in (1) emits blue light of 210 cd/m² upon application of 15 V, as described before. CIE chromaticity coordinates of said light were: x=0.15, y=0.28, which fell under blue green.

Then, the dispersion film of Pyridine 1 produced in (2) and the dispersion film of Rhodamine 6G produced in (3) were superimposed on the EL element on the side of ITO transparent electrode, and the emission on application of 15 V was observed through these two dispersion films. The CIE chromaticity coordinates were: x=0.62, y=0.37, which means the light was reddish orange in chromaticity.

The color of the light was nearer to red than in the case of Pyridine 1 alone.

As seen from the above, the fluorescent materials improve the selectivity of the light not only when a single organic dye is used but also when plural of them are used in proper combinations.

EXAMPLE 15

(1) Production of Organic EL Material Part

A laminate EL element part comprising 1,4-bis(2-phenyl-2-p-tolylvinyl)benzene (PTVB) as the emitting layer, and TPDA as the hole injection layer was produced in the same manner as in Example 1, except that the temperature of the boats in the vacuum deposition of PTVB was 200° C.

The light emitted from the EL element part thus prepared was blue, and the peak wavelength of said light was 485 nm.

On application of 20 V between the both electrodes, a current of 90 mA/cm² was passed, to obtain a brightness of 500 cd/m².

(2) Production of Wavelength Converting Fluorescent Material Part (Phenoxazone 9)

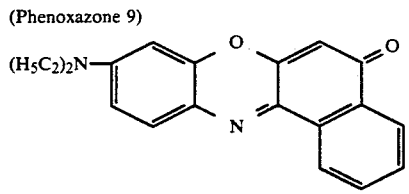

4 mg of Phenoxazone 9 having the above structure and 1.2 g of PMMA were dissolved into 11 g of dichloromethane, to prepare a PMMA dipersion film of Phenoxazone 9 by the casting method as in Example 1 (2). The concentration of Phenoxazone 9 dispersed was $1.3 \times 10^{-2}$ mol/liter.

The PMMA dispersion film thus prepared was approximately 80 μm in thickness.

Three sheets of said films were superimposed, to obtain a PMMA dispersion film of Phenoxazone 9 having a thickness of 240 μm.

(3) Determination of Emission of the EL Element

The light emitted from the EL element having the PTVB produced in (1) had CIE chromaticity coordinates: x=0.15, y=0.25, which fell under greenish blue in chromaticity.

The Phenoxazone dispersion film produced in (2) and the three sheets of PMMA dispersion film of Pyridine 1 produced in Example 3 (2) (thickness: 240 μm) were superimposed on ITO transparent electrode, and the emission of light on application of 15 V was observed through these two dispersion films, to obtain a red light which is visible in the light place and the dark place.

The CIE chromaticity coordinates of the light were: x=0.60, y=0.31, which fell under red in chromaticity.

In this way, by employing two fluorescent materials of Phenoxazone and Pyridine, a greenish blue light in chromaticity could be changed easily to a red light which is difficult to obtain from EL.

EXAMPLE 16

(1) Production of Organic EL Material Part

The same procedure was repeated as in Example 15 (1).

(2) Production of Wavelength Converting Fluorescent Material Part

The same procedure was repeated as in Example 15 (2).

(3) Determination of Emission by EL Element

The CIE chromaticity coordinates of the light emitted from the EL element having the PTVB produced in (1) as the emitting layer are: $x=0.15$, $y=0.25$, which means the light was greenish blue in chromaticity.

The Phenoxazone dispersion film produced in (2) and a Color Filter Y 52 (manufactured by HOYA Co., Ltd.) were superimposed on the ITO transparent electrode, and the emission of light on application of 15 V was observed through them. A red light visible in the light place and the dark place was obtained.

CIE chromaticity coordinates of the light were: $x=0.62$, $y=0.33$, which means the light was red in chromaticity.

In this way, by combining a Phenoxazone fluorescent material and a color filter, a greenish blue light in chromaticity could be changed easily to a red light which is difficult to obtain from EL.

PRODUCTION EXAMPLE 1

Production of EL Material Part

ITO was provided on a 25 mm×75 mm×1.1 mm glass substrate in a 100 nm thick film formed by the vacuum deposition method to obtain a transparent substrate. This transparent substrate was attached to the substrate holder of a commercially available vapor deposition system (manufactured by ULVAC Co., Ltd.), 200 mg of 3,5,3'''',5''''-tetrabutylquinquephenyl (TBQ) was placed in an electrically-boat made of molybdenum, and the pressure of the vacuum chamber was decreased to $1 \times 10^{-4}$ Pa.

Then, the above boat was heated to 270° to 290° C., TBQ was vacuum deposited onto the transparent substrate at a deposition rate of 0.2 to 0.5 nm/sec to obtain a crystalline luminescent film 0.7 μm thick. Here, the temperature of the substrate was 150° C. The substrate was taken out of the vacuum chamber and a stainless steel mask was placed on the luminescent film, which was attached to the substrate holder again.

Subsequently, in the electrically-heated boat made of molybdenum, was placed 20 mg of gold, and the pressure of the vacuum chamber was decreased to $2 \times 10^{-4}$ Pa.

Then, the boat was heated to 1400° C., and a gold electrode was formed in a 50 nm thick film on the luminescent film to be an opposite electrode.

To this element, a DC voltage of 60 V was applied, with the gold electrode being positive and the ITO electrode negative. As a result, a current of 50 μA was passed and an on-place emission was obtained from the whole range between both electrodes visible in the dark ranging from near ultraviolet area to visible blue light area. The luminous wavelength range was 380 to 500 nm and the maximum wavelength was 435 nm by the spectroscopic determination. The luminous intensity was 0.02 mW/cm$^2$ as determined by photodiode.

PRODUCTION EXAMPLE 2

Production of EL Material Part

ITO was provided on a 25 mm×75 mm×1.1 mm glass substrate in a 100 nm thick film formed by the vacuum deposition method to obtain a transparent substrate. This transparent substrate was attached to the substrate holder of a commercially available vacuum deposition system (manufactured by ULVAC CO., Ltd.), 200 mg of N,N'-diphenyl-N,N'-bis(3-methylphenyl)-[1,1'-biphenyl]-4,4'-diamine (TPDA) was placed in an electrically-heated boat made of molybdenum, 200 mg of TBQ was placed in another electrically-heated boat made of molybdenum in the same manner as in Production Example 1, and the pressure of the vacuum chamber was decreased to $1 \times 10^{-4}$ Pa.

Then, the above boat containing TPDA was heated to 215° to 220° C., and TPDA was vacuum deposited onto the transparent substrate at a deposition rate of 0.1 to 0.3 nm/sec to form a hole injection layer 90 nm thick. Here, the substrate was at room temperature. Without taking this substrate out of the vacuum chamber, onto the hole injection layer, TBQ of another boat was laminate deposited in a 70 nm thick film. The vacuum depositions conditions are the same as in Production Example 1 except that the substrate is at room temperature. This substrate was taken out of the vacuum chamber, and a stainless steel mask was placed on the above TBQ layer, which was attached to the substrate holder again.

Subsequently, in the electrically-heated boat made of molybdenum, was placed 1 g of magnesium ribbon, and a pellet of copper was attached as a target of an electron gun for the electron beam deposition located under the substrate holder in the center of the vacuum chamber. Then, after the pressure of the vacuum chamber was decreased to $2 \times 10^{-4}$ Pa, the copper was vacuum deposited at a deposition rate of 0.03 to 0.08 nm/sec by the electron beam deposition method, and at the same time magnesium of the molybdenum boat at a deposition rate of 1.7 to 2.8 nm/sec by the electrically-heating method. An emission current of the electron gun filament was 230 to 250 mA and an acceleration voltage was 4 kV. The temperature of the boat was about 500° C. Under the above conditions, the mixed metal electrode of magnesium and copper was laminate deposited onto TBQ layer in a 90 nm thick film to be an opposite electrode.

To this element, a DC voltage of 20 V was applied, with the ITO electrode being positive and the mixed metal electrode of magnesium and copper negative, and a current of 50 μA was passed and an emission was obtained ranging from near ultraviolet area to visible blue light area. The luminous wavelength range was 380 to 500 nm and the maximum wavelength was 435 nm by the spectroscopic determination. The luminous intensity was 0.08 mW/cm$^2$ as determined by the same method as in Production Example 1.

PRODUCTION EXAMPLE 3

Production of EL Material Part

ITO was provided on a 25 mm×75 mm×1.1 mm glass substrate in a 100 nm thick film formed by the vacuum deposition method to obtain a transparent substrate. This transparent substrate was attached to the substrate holder of a commercially available vacuum deposition system (manufactured by ULVAC Co., Ltd.), 200 mg of p-quater phenyl (PQP) was placed in an electrically-heated boat made of molybdenum, and the pressure of the vacuum chamber was decreased to $1 \times 10^{-4}$ Pa.

Then, the above boat was heated to 230° to 250° C., and PQP was vacuum deposited onto the transparent substrate at a deposition rate of 0.2 to 0.5 nm/sec to form a crystalline luminescent film 0.4 μm thick. Here, the substrate was at room temperature. This substrate was taken out of the vacuum chamber, and a stainless steel mask was placed on the luminescent film, which was attached to the substrate holder again.

Subsequently, in the electrically-heated boat made of molybdenum, was placed 20 mg of gold, and the pressure of the vacuum chamber was decreased to $2 \times 10^{-4}$ Pa.

Then, the boat was heated to 1400° C., and a gold electrode was formed in a 50 nm thick film on the luminescent film to be an opposite electrode.

To this element, a DC voltage of 40 V was applied, with the gold electrode being positive and the ITO electrode negative. As a result, a current of 3.2 mA was passed and an emission visible in the dark was obtained ranging from near ultraviolet area to visible blue light area. The luminous wavelength range was 360 to 550 nm and the maximum wavelength was 440 nm and 470 nm by the spectroscopic determination. The luminous intensity was 0.03 mW/cm² as determined by the same method as in Production Example 1.

PRODUCTION EXAMPLE 4

Production of EL Material Part

ITO was provided on a 25 mm×75 mm×1.1 mm glass substrate in a 100 nm thick film formed by the vapor deposition method to obtain a transparent substrate. This transparent substrate was attached to the substrate holder of a commercially available vacuum deposition system (manufactured by ULVAC Co., Ltd.), 200 mg of N,N'-diphenyl-N,N'-bis(3-methylphenyl)-[1,1'-biphenyl]-4,4'-diamine (TPDA) was placed in an electrically-heated boat made of molybdenum. 200 mg of PQP was placed in another electrically-heated boat made of molybdenum in the same manner as in Production Example 3, and the pressure of the vacuum chamber was decreased to $1 \times 10^{-4}$ Pa.

Then, the above boat containing TPDA was heated to 215° to 220° C., and TPDA was vacuum deposited onto the transparent substrate at a deposition rate of 0.1 to 0.3 nm/sec to form a hole injection transport layer 95 nm thick. Here, the substrate was at room temperature. Without taking this substrate out of the vacuum chamber, onto the hole injection transport layer, PQP of another boat was laminate deposited in a 60 nm thick film. The vacuum deposition conditions are the same as in Production Example 3. This substrate was taken out of the vacuum chamber, and a stainless steel mask was placed on the above PQP layer, which was attached to the substrate holder again.

Subsequently, in the electrically-heated boat made of molybdenum, was placed 1 g of magnesium ribbon, and a pellet of copper was attached as a target of an electron gun for the electron beam deposition located under the substrate holder in the center of the vacuum chamber. Then, after the pressure of the vacuum chamber was decreased to $2 \times 10^{-4}$ Pa, the copper was vacuum deposited at a deposition rate of 0.03 to 0.08 nm/sec by the electron beam deposition method, and at the same time magnesium on the molybdenum boat at a deposition rate of 1.7 to 2.8 nm/sec by the electrically-heating method. An emission current of the electron gun filament was 230 to 250 mA and an acceleration voltage was 4 kV. The temperature of the boat was about 500° C. Under the above conditions, the mixed metal electrode of magnesium and copper was laminate deposited onto a PQP layer in a 130 nm thick film to be an opposite electrode.

To this element, a DC voltage of 20 V was applied, with the ITO electrode being positive and the mixed metal electrode of magnesium and copper negative, and a current of 3.5 mA was passed and an emission was obtained ranging from near ultraviolet area to visible blue light area. The luminous wavelength range was 360 to 500 nm and the maximum wavelength was 420 nm by the spectroscopic determination. The luminous intensity was 0.2 mW/cm² as determined by the same method as in Production Example 1.

PRODUCTION EXAMPLE 5

Production of EL Material Part

ITO was provided on a 25 mm×75 mm×1.1 mm glass substrate in a 100 nm thick film formed by the vapor deposition method to obtain a transparent substrate. This transparent substrate was attached to the substrate holder of a commercially available vacuum deposition system (manufactured by ULVAC Co., Ltd.), 200 mg of N,N'-diphenyl-N,N'-bis(3-methoxyphenyl)-[1,1'-biphenyl]-4,4'-diamine (MPDA) was placed in an electrically-heated boat made of molybdenum, 200 mg of PQP was placed in another electrically-heated boat made of molybdenum, and the pressure of the vacuum chamber was decreased to $1 \times 10^{-4}$ Pa.

Then, the above boat containing MPDA was heated to 220° C., MPDA was vapor deposited onto the transparent substrate at a deposition rate of 0.1 to 0.3 nm/sec to form a hole injection layer 60 nm thick. Here, the substrate was at room temperature. Without taking this substrate out of the vacuum chamber, onto the hole injection layer, PQP was laminate deposited in a 60 nm thick film. As to the vacuum deposition conditions, the temperature of the boat was 218° C., the deposition rate was 0.3 to 0.5 nm/sec, and the substrate was at room temperature. This substrate was taken out of the vacuum chamber, and a stainless steel mask was placed on the above PQP layer, which was attached to the substrate holder again.

Subsequently, in the electrically-heated boat made of molybdenum, was placed 1 g of magnesium ribbon, and 500 mg of indium was attached to another molybdenum boat. Then, after the pressure of the vacuum chamber was decreased to $2 \times 10^{-4}$ Pa, the indium was vacuum deposited at a deposition rate of 0.1 nm/sec, and at the same time magnesium of the other molybdenum boat at a deposition rate of 1.7 to 2.8 nm/sec. The temperature of the boat of the indium was about 800° C., and that of magnesium was about 500° C.

Under the above conditions, the mixed metal electrode of magnesium and indium was laminate deposited onto the PQP layer in a 150 nm thick film to be an opposite electrode.

To this element, a DC voltage of 7.5 V was applied, with the ITO electrode being positive and the mixed metal electrode of magnesium and indium negative, and a current of 7 mA/cm² was passed and an emission of violet light visible in the light was obtained.

The detailed luminous wavelength range was 380 to 600 nm and the maximum wavelength was 436 nm by the spectroscopic determination. The luminous intensity was 0.03 mW/cm$^2$ as determined by the power determination of the photodiode determination under the above conditions.

PRODUCTION EXAMPLE 6

Production of EL Material Part

ITO was provided on a 25 mm×75 mm×1.1 mm glass substrate in a 100 nm thick film formed by the vacuum deposition method to obtain a transparent substrate. This transparent substrate was attached to the substrate holder of a commercially available vapor deposition system (manufactured by ULVAC Co., Ltd.), 200 mg of 1,1-bis(4-di-para-trylaminophenyl)cyclohexane (TPAC) was placed in an electrically-heated boat made of molybdenum, 200 mg of PQP was placed in another electrically-heated boat made of molybdenum and the pressure of the vacuum chamber was decreased to $1 \times 10^{-4}$ Pa.

Then, the above boat containing TPAC was heated to 220° C., and TPAC was vacuum deposited onto the transparent substrate at a deposition rate of 0.1 to 0.3 nm/sec to form a hole injection layer 60 nm thick. Here, the substrate was at room temperature. Without taking this substrate out of the vacuum chamber, onto the hole injection layer, PQP was laminate deposited in a 60 nm thick film as an emitting layer (luminescent film). As to the vacuum deposition conditions, the temperature of the boat was 218° C., the deposition rate was 0.3 to 0.5 nm/sec, and the substrate was at room temperature. This substrate was taken out of the vacuum chamber, and a stainless steel mask was placed on PQP film, which was attached to the substrate holder again.

Subsequently, in the electrically-heated boat made of molybdenum, was placed 1 g of magnesium ribbon, and 500 mg of indium was attached to another molybdenum boat. Then, after the pressure of the vacuum chamber was decreased to $2 \times 10^{-4}$ Pa, the indium was vacuum deposited at a deposition rate of 0.1 nm/sec, and at the same time magnesium of the other molybdenum boat at a deposition rate of 1.7 to 2.8 nm/sec. The temperature of the boat of the indium was about 800° C., and that of magnesium was about 500° C.

Under the above conditions, the mixed metal electrode of magnesium and indium was laminate deposited onto the PQP layer in a 150 nm thick film to be an opposite electrode.

To this element, a DC voltage of 15 V was applied, with the ITO electrode being positive and the mixed metal electrode of magnesium and indium negative, and a current of 8.4 mA/cm$^2$ was passed and an emission of blue violet light visible in the light was obtained.

The detailed luminous wavelength range was 380 to 600 nm and the maximum wavelength was 450 nm by the spectroscopic determination. The luminous intensity was 0.05 mW/cm$^2$ as determined by photodiode.

PRODUCTION EXAMPLE 7

Production of EL Material Part

ITO was provided on a 25 mm×75 mm×1.1 mm glass substrate in a 100 nm thick film formed by the vapor deposition method to obtain a transparent substrate. This transparent substrate was attached to the substrate holder of a commercially available vacuum deposition system (manufactured by ULVAC Co., Ltd.), 200 mg of N,N'-diphenyl-N,N'-bis(3-methylphenyl)-[1,1-biphenyl]-4,4'-diamine (TPDA') was placed in an electrically-heated boat made of molybdenum, 200 mg of PQP was placed in another electrically-heated boat made of molybdenum and the pressure of the vacuum chamber was decreased to $1 \times 10^{-4}$ Pa.

Then, the above boat containing TPDA' was heated to 220° C., and TPDA' was vacuum deposited onto the transparent substrate at a deposition rate of 0.1 to 0.3 nm/sec to form a hole injection layer 60 nm thick. Here, the substrate was at room temperature. Without taking this substrate out of the vacuum chamber, onto the hole injection layer, PQP was laminate deposited in a 60 nm thick film. As to the deposition conditions, the temperature of the boat was 218° C., the deposition rate was 0.3 to 0.5 nm/sec, and the substrate was at room temperature. This substrate was taken out of the vacuum chamber, and a stainless steel mask was placed on the above PQP layer, which was attached to the substrate holder again.

Subsequently, in the electrically-heated boat made of molybdenum, was placed 1 g of magnesium ribbon, and 500 mg of indium was attached to another molybdenum boat. Then, after the pressure of the vacuum chamber was decreased to $2 \times 10^{-4}$ Pa, the indium was vacuum deposited at a deposition rate of 0.1 nm/sec, and at the same time magnesium of the other molybdenum boat at a deposition rate of 1.7 to 2.8 nm/sec. The temperature of the boat of the indium was about 800° C., and that of magnesium was about 500° C.

Under the above conditions, the mixed metal electrode of magnesium and indium was laminate deposited onto PQP layer in a 150 nm thick film to be an opposite electrode.

To this element, a DC voltage of 10 V was applied, with the ITO electrode being positive and the mixed metal electrode of magnesium and indium negative, and a current of 4.2 mA/cm$^2$ was passed and an emission of blue violet light visible in the light was obtained.

The detailed luminous wavelength range was 380 to 700 nm and the maximum wavelength was 430 nm by the spectroscopic determination. An emission was observed in the wide wavelength range from near ultraviolet area to longwave length area. The luminous intensity was 0.05 nW/cm as determined by photodiode.

PRODUCTION EXAMPLE 8

Production of EL Material Part

ITO was provided on a 25 mm×75 mm×1.1 mm glass substrate in a 100 nm thick film formed by the vacuum deposition method to obtain a transparent substrate. This transparent substrate was attached to the substrate holder of a commercially available vacuum deposition system (manufactured by ULVAC Co., Ltd.), 200 mg of 1,1'-bis(4-di-para-trylaminophenyl)cyclohexane (TPAC) was placed in an electrically-heated boat made of molybdenum, 200 mg of 3,5,3''',5''''-tetrabutylquinquephenyl (TBQ) was placed in another electrically-heated boat made of molybdenum and the pressure of the vacuum chamber was decreased to $1 \times 10^{-4}$ Pa.

Then, the above boat containing TPAC was heated to 220° C., and TPAC was vacuum deposited onto the transparent substrate at a deposition rate of 0.1 to 0.3 nm/sec to form a hole injection layer 60 nm thick. Here, the substrate was at room temperature. Without taking this substrate out of the vacuum chamber, onto the hole injection layer, TBQ was laminate deposited in a 60 nm thick film. As to the vacuum deposition conditions, the temperature of the boat was 220° C., the deposition rate was 0.3 to 0.5 nm/sec, and the substrate was at room temperature. This substrate was taken out of the vacuum chamber, and a stainless steel mask was placed on the above TBQ film, which was attached to the substrate holder again.

Subsequently, in the electrically-heated boat made of molybdenum, was placed 1 g of magnesium ribbon, and 500 mg of indium was attached to another molybdenum boat. Then, after the pressure of the vacuum chamber was decreased to $2 \times 10^{-4}$ Pa, the indium was vacuum deposited at a deposition rate of 0.1 nm/sec, and at the same time magnesium of the other molybdenum boat at a deposition rate of 1.7 to 2.8 nm/sec. The temperature of the boat of the indium was about 800° C, and that of magnesium was about 500° C.

Under the above conditions, the mixed metal electrode of magnesium and indium was laminate deposited onto TBQ layer in a 150 nm thick film to be an opposite electrode.

To this element, a DC voltage of 15 V was applied, with the ITO electrode being positive and the mixed metal electrode of magnesium and indium negative, and a current of 11 mA/cm$^2$ was passed and an emission visible in the light was obtained. The luminous wavelength was in the wide range of 400 nm to long wavelength by the spectroscopic determination. The luminous intensity under the above conditions was 0.02 mW/cm$^2$ as determined by photodiode.

PRODUCTION EXAMPLE 9

Production of EL Material Part

ITO was provided on a 25 mm × 75 mm × 1.1 mm glass substrate in a 100 mn thick film formed by the vapor deposition method to obtain a transparent substrate. This transparent substrate was attached to the substrate holder of a commercially available vacuum deposition system (manufactured by ULVAC Co., Ltd.), 200 mg of 1,1'-bis(4-dimetha-trylaminophenyl)ether (ETPA) was placed in an electrically-heated boat made of molybdenum, 200 mg of 3,5,3''',5''''-tetrabutylquinquephenyl (TBQ) was placed in another electrically-heated boat made of molybdenum and the pressure of the vacuum chamber was decreased to $1 \times 10^{-4}$ Pa.

Then, the above boat containing ETPA was heated to 210° C., and ETPA was vacuum deposited onto the transparent substrate at a deposition rate of 0.1 to 013 nm/sec to form a hole injection layer 60 nm thick. Here, the substrate was at room temperature. Without taking this substrate out of the vacuum chamber, onto the hole injection layer, TBQ was laminate deposited in a 60 nm thick film. As to the vacuum deposition conditions, the temperature of the boat was 220° C., the vapor deposition rate was 0.3 to 0.5 nm/sec, and the substrate was at room temperature. This substrate was taken out of the vacuum chamber, and a stainless steel mask was placed on the above TBQ film, which was attached to the substrate holder again.

Subsequently, in the electrically-heated boat made of molybdenum, was placed 1 g of magnesium ribbon, and 500 mg of indium was attached to another molybdenum boat. Then, after the pressure of the vacuum chamber was decreased to $2 \times 10^{-4}$ Pa, the indium was vapor deposited at a deposition rate of 0.1 nm/sec, and at the same time magnesium of the other molybdenum boat at a deposition rate of 1.7 to 2.8 nm/sec. The temperature of the boat of the indium was about 800° C., and that of magnesium was about 500° C.

Under the above conditions, the mixed metal electrode of magnesium and indium was laminate deposited onto TBQ layer in a 150 nm thick film to be an opposite electrode.

To this element, a DC voltage of 15 V was applied, with the ITO electrode being positive and the mixed metal electrode of magnesium and indium negative, and a current of 1.5 mA/cm$^2$ was passed and an emission of violet light visible in the light was obtained. The luminous wavelength range was 360 nm to 600 nm by the spectroscopic determination and an emission of near ultraviolet was observed. The luminous intensity under the above conditions was 0.06 mW/cm$^2$ as determined by photodiode.

PRODUCTION EXAMPLE 10

Production of EL Material Part

ITO was provided on a 25 mm × 75 mm × 1.1 mm glass substrate in a 100 nm thick film formed by the vacuum deposition method to obtain a transparent substrate. This transparent substrate was attached to the substrate holder of a commercially available vacuum deposition system (manufactured by ULVAC Co., Ltd.), 200 mg of N,N'-diphenyl-N,N'-bis(3-methylphenyl)-[1,1-biphenyl]-4,4'-diamine (TPDA*) was placed in an electrically-heated boat made of molybdenum, 200 mg of 3,5,3''',5''''-tetrabutylquinquephenyl (TBQ) was placed in another electrically-heated boat made of molybdenum and the pressure of the vacuum chamber was decreased to $1 \times 10^{-4}$ Pa.

Then, the above boat containing TPDA' was heated to 210° C., and TPDA' was vacuum deposited onto the transparent substrate at a deposition rate of 0.1 to 0.3 nm/sec to form a hole injection layer 60 nm thick. Here, the substrate was at room temperature. Without taking this substrate out of the vacuum chamber, onto the hole injection layer, TBQ was laminate vapor deposited in a 60 nm thick film. As to the vapor deposition conditions, the temperature of the boat was 220° C., the vapor deposition rate was 0.3 to 0.5 nm/sec, and the substrate was at room temperature. This substrate was taken out of the vacuum chamber, and a stainless steel mask was placed on the above luminescent film, which was attached to the substrate holder again.

Subsequently, in the electrically-heated boat made of molybdenum, was placed 1 g of magnesium ribbon, and 500 mg of indium was attached to another molybdenum boat. Then, after the pressure of the vacuum chamber was decreased to $2 \times 10^{-4}$ Pa, the indium was vapor deposited at a deposition rate of 0.1 nm/sec, and at the same time magnesium of the other molybdenum boat at a deposition rate of 1.7 to 2.8 nm/sec. The temperature of the boat of the indium was about 800° C., and that of magnesium was about 500° C.

Under the above conditions, the mixed metal electrode of magnesium and indium was laminate deposited onto TBQ layer in a 150 nm thick film to be an opposite electrode.

To this element, a DC voltage of 15 V was applied, with the ITO electrode being positive and the mixed metal electrode of magnesium and indium negative, and a current of 27 mA/cm$^2$ was passed and an emission of violet light visible in the light was obtained. The luminous wavelength range was 360 nm to 550 nm by the spectroscopic determination and an emission of near ultraviolet was observed. The luminous intensity under the above conditions was 1.0 mW/cm² at the time of applying 20 V as determined by the power determination of photodiode.

PRODUCTION EXAMPLE 11

Production of EL Material Part

ITO was provided on a 25 mm×75 mm×1.1 mm glass substrate in a 100 nm thick film formed by the vacuum deposition method to obtain a transparent substrate. This transparent substrate was attached to the substrate holder of a commercially available vacuum deposition system (manufactured by ULVAC Co., Ltd.), 200 mg of N,N'-diphenyl-N,N'-bis(3-methoxyphenyl)-[1,1-biphenyl]-4,4'-diamine (MPDA) was placed in an electrically-heated boat made of molybdenum, 200 mg of 3,5,3''',5''''-tetrabutylquinquephenyl (TBQ) was placed in another electrically-heated boat made of molybdenum and the pressure of the vacuum chamber was decreased to $1 \times 10^{-4}$ Pa.

Then, the above boat containing MPDA was heated to 220° C., and MPDA was vacuum deposited onto the transparent substrate at a deposition rate of 0.1 to 0.3 nm/sec to form a hole injection layer 60 nm thick. Here, the substrate was at room temperature. Without taking this substrate out of the vacuum chamber, onto the hole injection layer, TBQ was laminate deposited in a 60 nm thick film. As to the vacuum deposition conditions, the temperature of the boat was 220° C., the deposition rate was 0.3 to 0.5 nm/sec, and the substrate was at room temperature. This substrate was taken out of the vacuum chamber, and a stainless steel mask was placed on the above TBQ layer, which was attached to the substrate holder again.

Subsequently, in the electrically-heated boat made of molybdenum, was placed 1 g of magnesium ribbon, and 500 mg of indium was attached to another molybdenum boat. Then, after the pressure of the vacuum chamber was decreased to $2 \times 10^{-4}$ Pa, the indium was vacuum deposited at a deposition rate of 0.1 nm/sec, and at the same time magnesium of the other molybdenum boat at a deposition rate of 1.7 to 2.8 nm/sec. The temperature of the boat of the indium was about 800° C., and that of magnesium was about 500° C.

Under the above conditions, the mixed metal electrode of magnesium and indium was laminate deposited onto TBQ layer in a 150 nm thick film to be an opposite electrode.

To this element, a DC voltage of 15 V was applied, with the ITO electrode being positive and the mixed metal electrode of magnesium and indium negative, and a current of 12 mA/cm² was passed and an emission of violet light visible in the light was obtained. The luminous wavelength range was 370 nm to 550 nm with the maximum wavelength of 430 nm by the spectroscopic determination and an emission of near ultraviolet was observed. The luminous intensity was 0.7 mW/cm at the time of applying 20 V as determined by the power determination of the photodiode.

What is claimed is:

1. An electroluminescent element comprising an organic electroluminescent material part which emits a blue light and at least one fluorescent material part which absorbs said blue light and emits a fluorescence in a visible light range from bluish green to red light said fluorescent material part exists outside of the electroluminescent material part.

2. The electroluminescent element as claimed in claim 1, wherein the fluorescent material part comprises a plurality of fluorescent materials.

3. The electroluminescent element as claimed in claim 1 which is formed by laminating the organic electroluminescent material part and the fluorescent material part.

4. The electroluminescent element as claimed in claim 1 wherein the organic electroluminescent material part is placed horizontally in line with the fluorescent material part.

5. The electroluminescent element as claimed in claim 1, wherein the organic electroluminescent material part comprises a compound which emits a blue light, sandwiched between two electrodes, at least one of which electrodes is transparent or semitransparent.

6. The electroluminescent element as claimed in claim 5, wherein the organic electroluminescent material part comprises a laminate of a layer of the compound which emits a blue light and a hole injection layer, said laminate being sandwiched between two electrodes, at least one of which electrodes is transparent or semitransparent.

7. The electroluminescent element as claimed in claim 1, wherein the fluorescent material part comprises a fluorescent material comprising a stilbene-based dye, a coumarin-based dye, a cyanine-based dye, a pyridine-based dye, a xanthene-based dye or an oxadine-based dye.

8. The electroluminescent element as claimed in claim 1, wherein the organic electroluminescent material is selected from the group consisting of

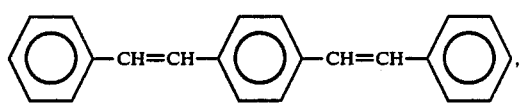

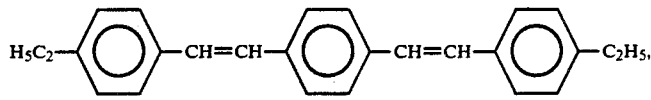

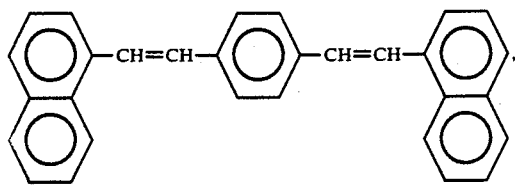
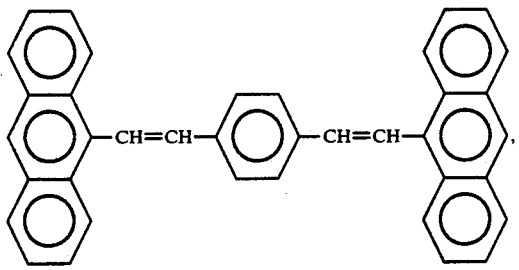
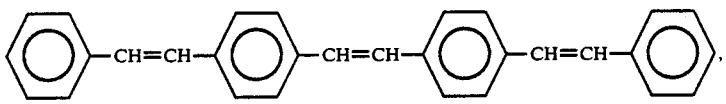
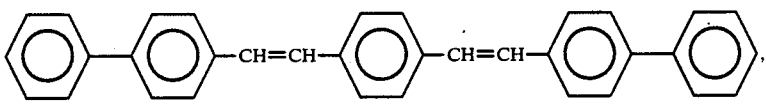
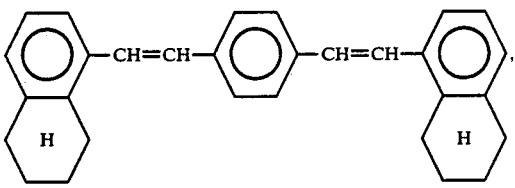
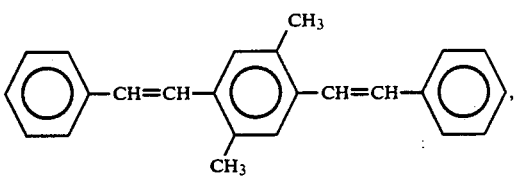
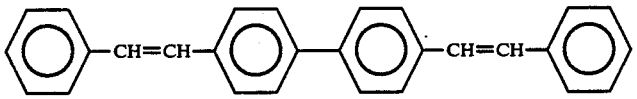
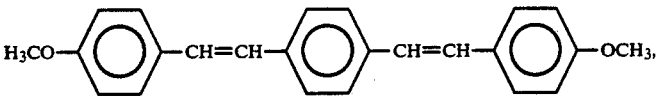
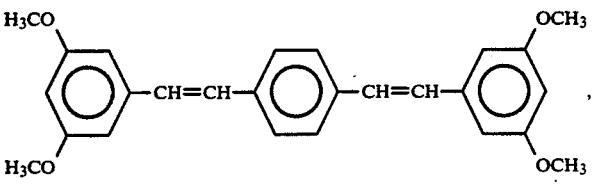

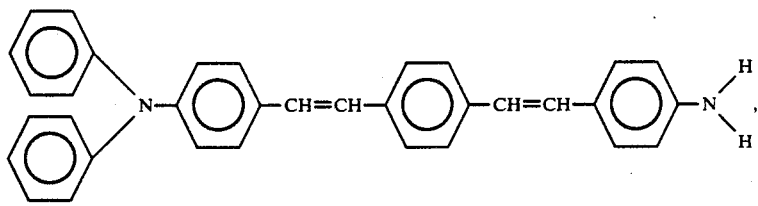
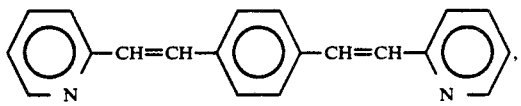
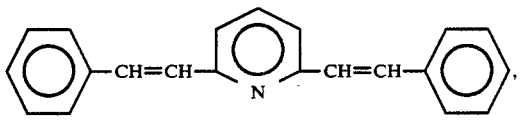
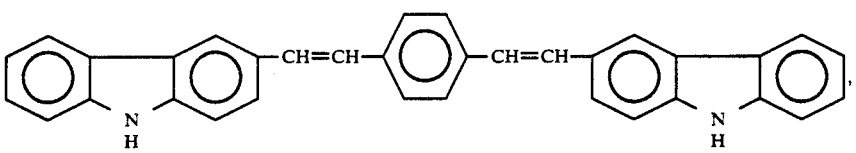
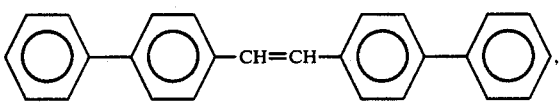
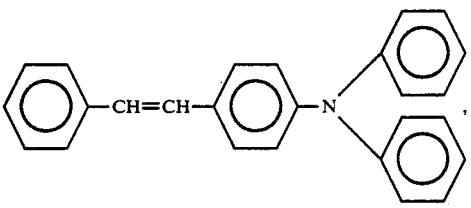
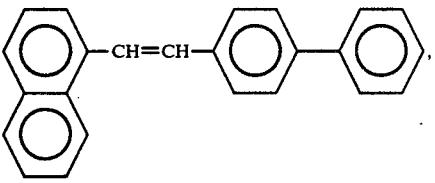
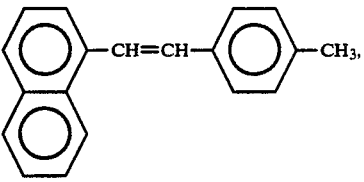
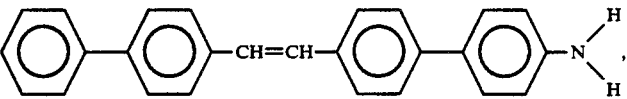

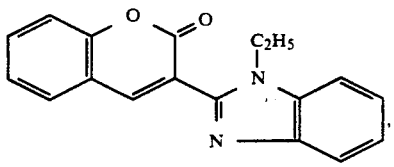

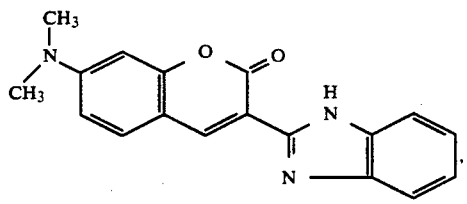

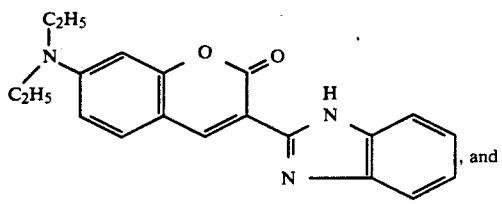
, and

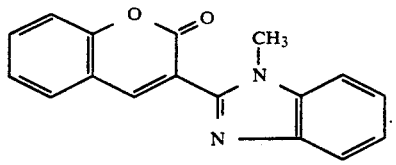

9. The electroluminescent element as claimed in claim 1, wherein the fluorescent material part comprises at least one dye selected from the group consisting of 4-dicyanomethylene-2-methyl-6-(p-dimethylaminostyrylene)-4-H-pyran, 1-ethyl-2-(4-(p -dimethylaminophenyl)-1,3-butadienyl)-pyridium-perchorat, rhodamine B, rhodamine G and 2,3,5,6-H,4H-tetrahydro-8-trichloromethylquinolizino-(9,9a,1-gh)-coumarin.

10. The electroluminescent element as claimed in claim 3, wherein the organic electroluminescent material comprises a film with a thickness of 5nm to 5-82 m; the fluorescent material part comprises a film with a thickness of 100 nm to 5 nm; and the fluorescent material comprises a dye dispersed in a resin, said dye having a concentration of $10^{-2}$ to $10^{-4}$ moles/liter based on the resin.

11. The electroluminescent element as claimed in claim 1, wherein the organic electroluminescent material part comprises a compound which emits a blue light, sandwiched between two electrodes, at least one of which is transparent or semitransparent and said element is formed by laminating the organic electroluminescent material part and the fluorescent material part.

12. The electroluminescent element as claimed in claim 1, wherein the organic electroluminescent material part comprises a compound which emits a blue light, sandwiched between two electrodes, at least one of which is transparent or semitransparent and said electroluminescent material part is placed horizontally in line with the fluorescent material.

13. The electroluminescent element as claimed in claim 5, wherein the organic electroluminescent material part comprises a laminate of a layer of the compound which emits a blue light and a hole injection layer, said laminate being sandwiched between two electrodes, at least one of which electrodes is transparent or semitransparent and said element is formed by laminating the organic electroluminescent material part and the fluorescent material part.

14. The electroluminescent element as claimed in claim 5, wherein the organic electroluminescent material part comprises a laminate of a layer of the compound which emits a blue light and a hole injection layer, said laminate being sandwiched between two electrodes, at least one of which electrodes is transparent or semitransparent and the organic electroluminescent material part is placed horizontally in line with the fluorescent material part.

15. The electroluminescent element as claimed in claim 1, wherein the organic electroluminescent material is selected from the group consisting of

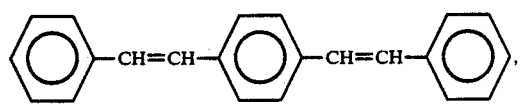

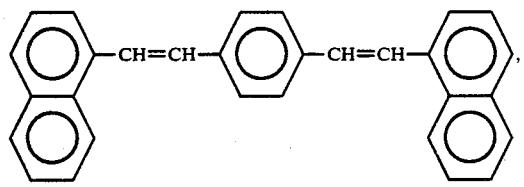
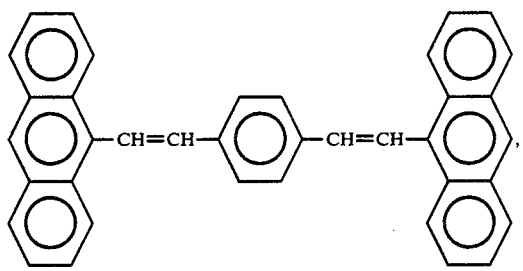
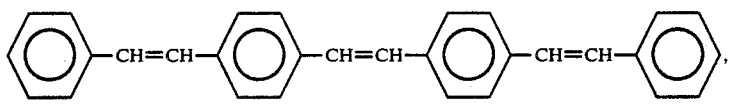
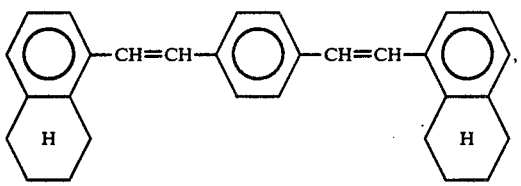
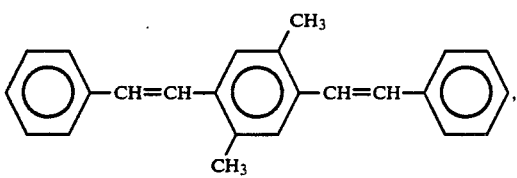
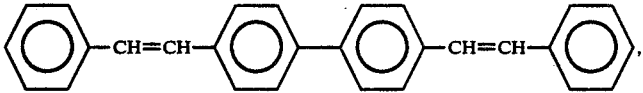

-continued
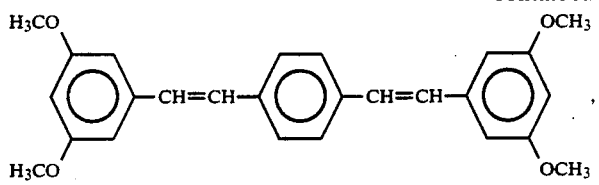
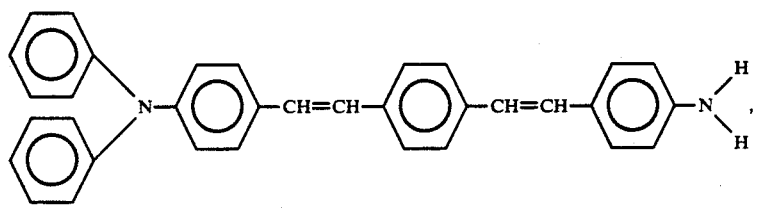
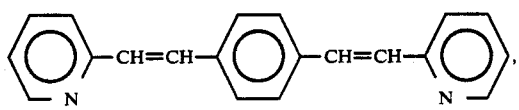
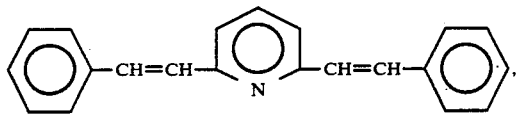
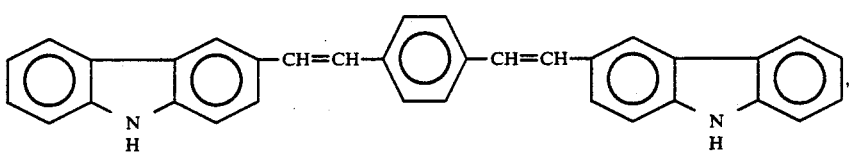
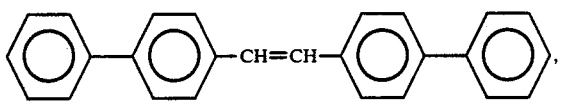
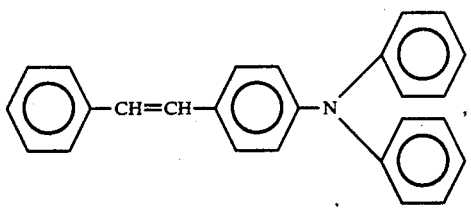
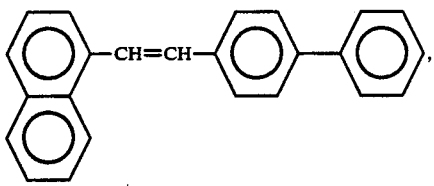
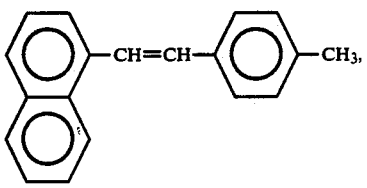

-continued
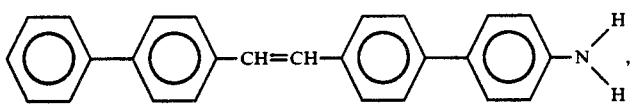
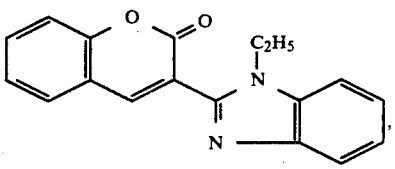
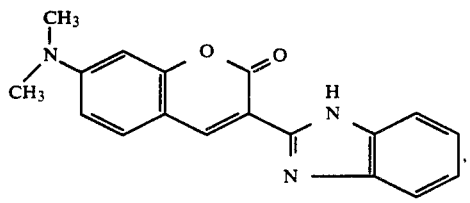
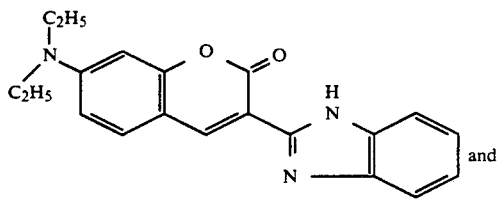
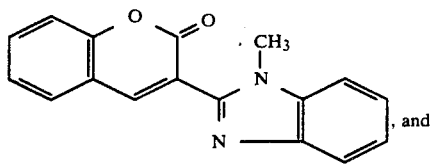
said electroluminescent element is formed by laminating the organic electroluminescent material part and the fluorescent material part.
16. The electroluminescent element as claimed in claim 1, wherein the organic electroluminescent material is selected from the group consisting of
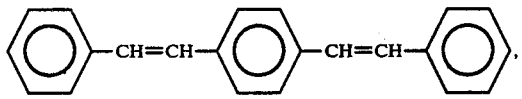
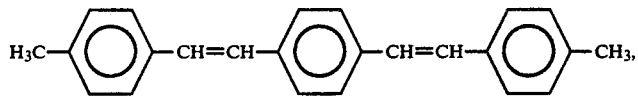

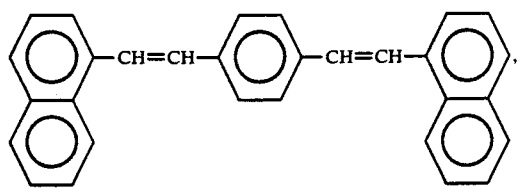
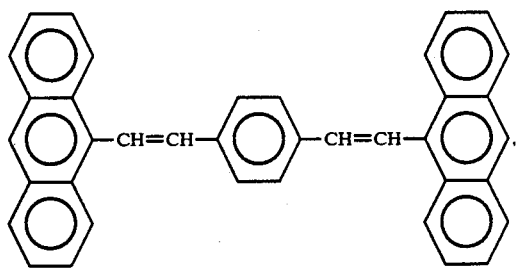
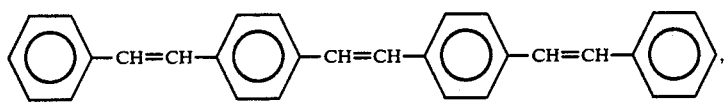
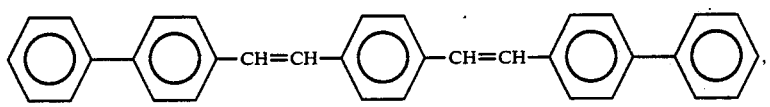
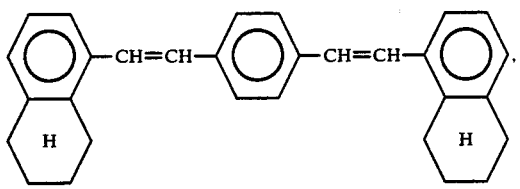
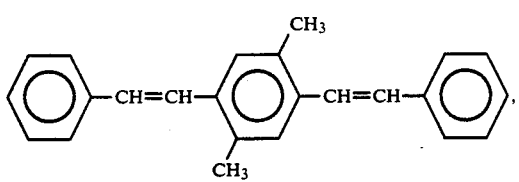
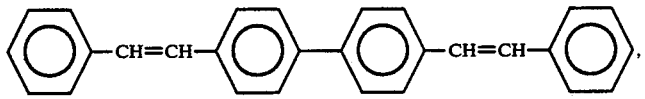
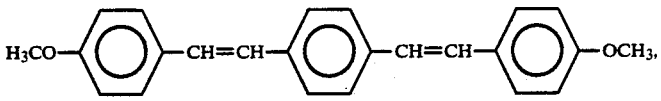
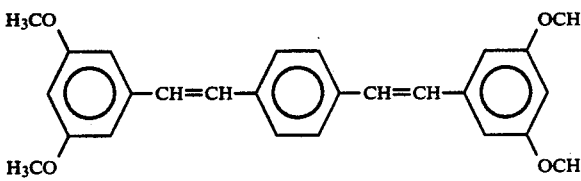

-continued
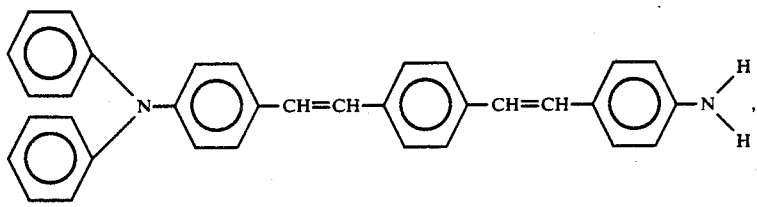
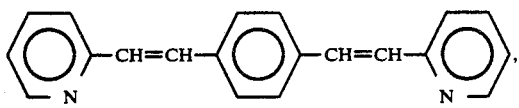
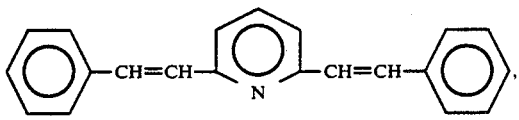
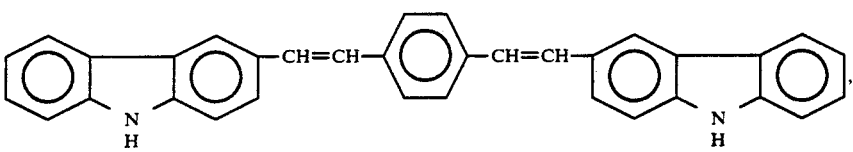
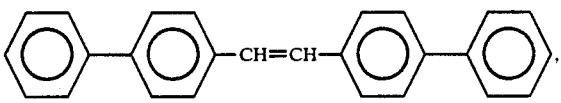
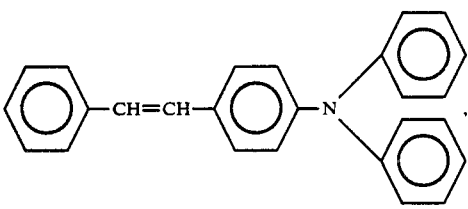
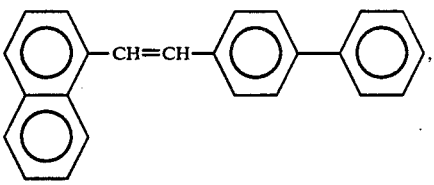
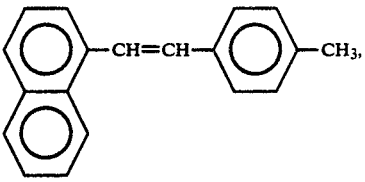
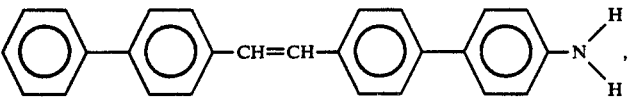

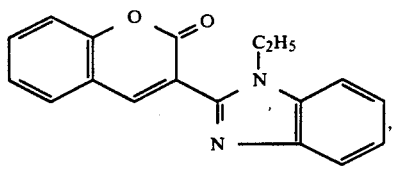
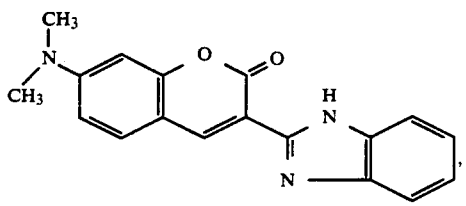
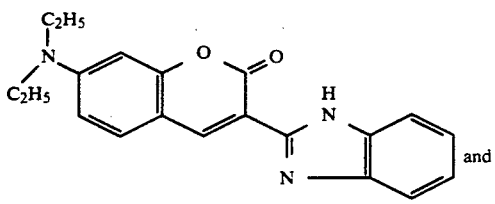
, and
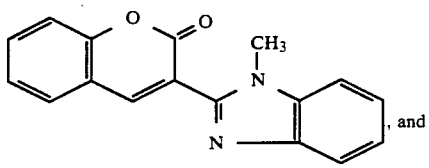
, and
wherein the organic and electroluminescent material is placed horizontally in line with the fluorescent material part.
* * * * *

UNITED STATES PATENT AND TRADEMARK OFFICE
CERTIFICATE OF CORRECTION

PATENT NO. : 5,126,214
DATED : June 30, 1992
INVENTOR(S) : Hiroshi TOKAILIN et al It is certified that error appears in the above-identified patent and that said Letters Patent is hereby corrected as shown below:

Column 41, line 38 (claim 9), delete "-4-H-pyran" and insert
-- -4H-pyran --.

Column 41, line 42 (claim 10), delete "claim 3" and insert
--claim 1--.

Column 41, line 44 (claim 10), delete "5-82 m" and insert
--5 μm--.

Signed and Sealed this

Sixth Day of September, 1994

Attest:

BRUCE LEHMAN

Attesting Officer    Commissioner of Patents and Trademarks